(12) United States Patent
Lu et al.

(10) Patent No.: US 11,539,461 B2
(45) Date of Patent: Dec. 27, 2022

(54) ENCODING METHOD AND RELATED DEVICE

(71) Applicant: Huawei Technologies Co., Ltd., Shenzhen (CN)

(72) Inventors: Yuchun Lu, Beijing (CN); Lin Ma, Beijing (CN); Liang Li, Beijing (CN); Yongyao Li, Shenzhen (CN); Shengyu Shen, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 153 days.

(21) Appl. No.: 17/100,394

(22) Filed: Nov. 20, 2020

(65) Prior Publication Data

US 2021/0075540 A1      Mar. 11, 2021

Related U.S. Application Data

(63) Continuation of application No. PCT/CN2019/087728, filed on May 21, 2019.

(30) Foreign Application Priority Data

May 21, 2018   (CN) .......................... 201810490240.2

(51) Int. Cl.
*H04L 1/00*   (2006.01)
*H04L 1/20*   (2006.01)

(52) U.S. Cl.
CPC .......... *H04L 1/0057* (2013.01); *H04L 1/0042* (2013.01); *H04L 1/203* (2013.01)

(58) Field of Classification Search
CPC ... H04L 1/0042; H04L 1/0041; H04L 1/0057; H04L 1/0071; H04L 1/0045; H04L 1/0038; H04L 1/245; H04L 1/203; H03M 13/1515
See application file for complete search history.

(56) References Cited

U.S. PATENT DOCUMENTS 6,981,194 B1    12/2005   Pass
2008/0205636 A1   8/2008   Nimbalker et al.
(Continued)

FOREIGN PATENT DOCUMENTS

CN    101267210 A   9/2008
CN    101529775 A   9/2009
(Continued)

OTHER PUBLICATIONS

IEEE Standards Association, "IEEE Standard for Ethernet; Amendment 2: Physical Layer Specifications and Management Parameters for 100 Gb/s Operation Over Backplanes and Copper Cables", IEEE Computer Society, IEEE Std 802.3bj™-2014, Approved Jun. 12, 2014, 368 pages.

(Continued)

*Primary Examiner* — Oussama Roudani
(74) *Attorney, Agent, or Firm* — Slater Matsil, LLP

(57) ABSTRACT

Embodiments of this application disclose an encoding method and a related device. The method includes: receiving a to-be-encoded code block whose length is L, where L is a positive integer; and encoding the to-be-encoded code block to obtain a forward error correction FEC code, where a valid information length K of the FEC code is an integer multiple of a largest prime factor of L, and a total length N of the FEC code is a sum of K and a product of 2 and an error correction capability T of the FEC code. According to the embodiments of this application, it can be ensured that an FEC codeword satisfies a requirement for a low latency and a high gain.

16 Claims, 20 Drawing Sheets

(56) References Cited

U.S. PATENT DOCUMENTS

| | | | |
|---|---|---|---|
| 2010/0293441 A1* | 11/2010 | Booth | H03M 13/333 |
| | | | 714/776 |
| 2010/0313093 A1 | 12/2010 | Takaku | |
| 2012/0179949 A1 | 7/2012 | Wang et al. | |
| 2012/0266051 A1 | 10/2012 | Farhoodfar et al. | |
| 2014/0254640 A1* | 9/2014 | Lusted | H04L 5/1438 |
| | | | 375/219 |
| 2014/0380132 A1 | 12/2014 | Ran | |
| 2016/0261443 A1 | 9/2016 | Malik et al. | |
| 2018/0123733 A1 | 5/2018 | Yang et al. | |
| 2019/0114282 A1* | 4/2019 | Kobayashi | G06F 13/42 |
| 2020/0145022 A1* | 5/2020 | Basso | H04L 1/0045 |

FOREIGN PATENT DOCUMENTS

| | | |
|---|---|---|
| CN | 101656593 A | 2/2010 |
| CN | 101877620 A | 11/2010 |
| CN | 102215402 A | 10/2011 |
| CN | 102891731 A | 1/2013 |
| EP | 1583263 B1 | 10/2006 |
| EP | 3702927 A1 | 9/2020 |
| WO | 2015133288 A1 | 9/2015 |

OTHER PUBLICATIONS

IEEE Standards Association, "IEEE Standard for Ethernet; Amendment 10: Media Access Control Paramerters, Physical Layers, and Management Parameters for 200 Gb/s and 400 Gb/s Operation", IEEE Computer Society, IEEE Std 802.3bs™-2017, Approved Dec. 6, 2017, 372 pages.

* cited by examiner

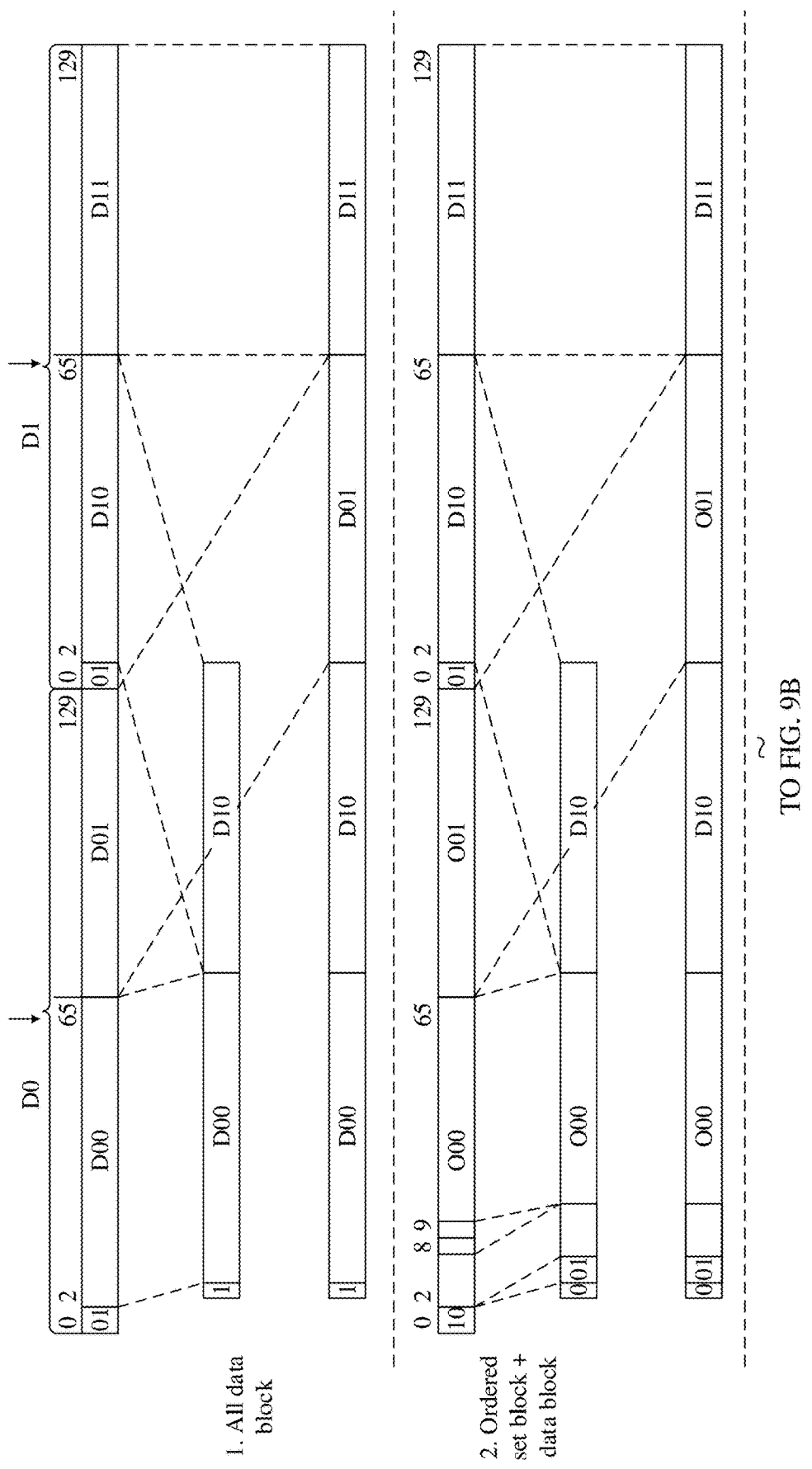

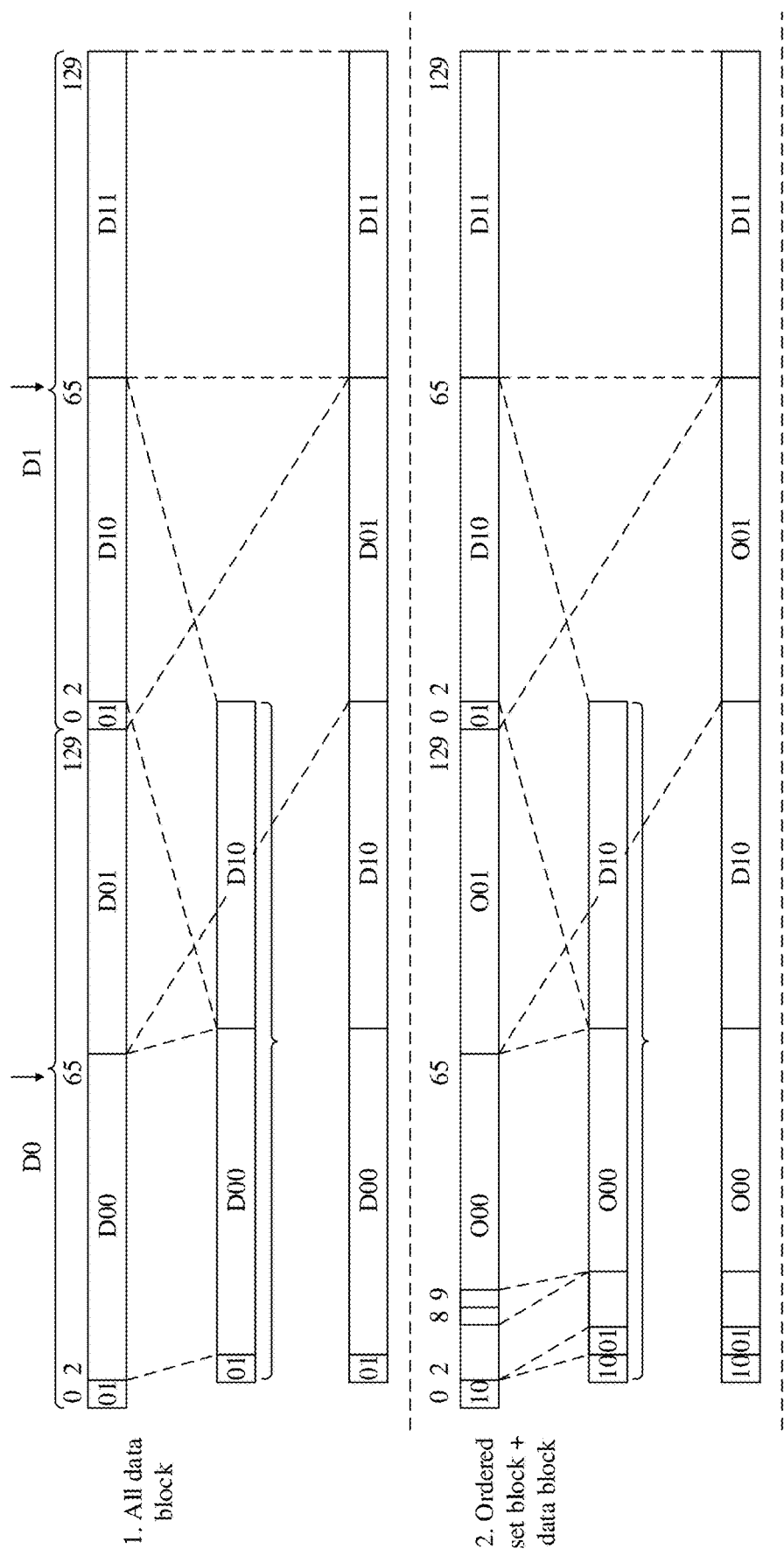

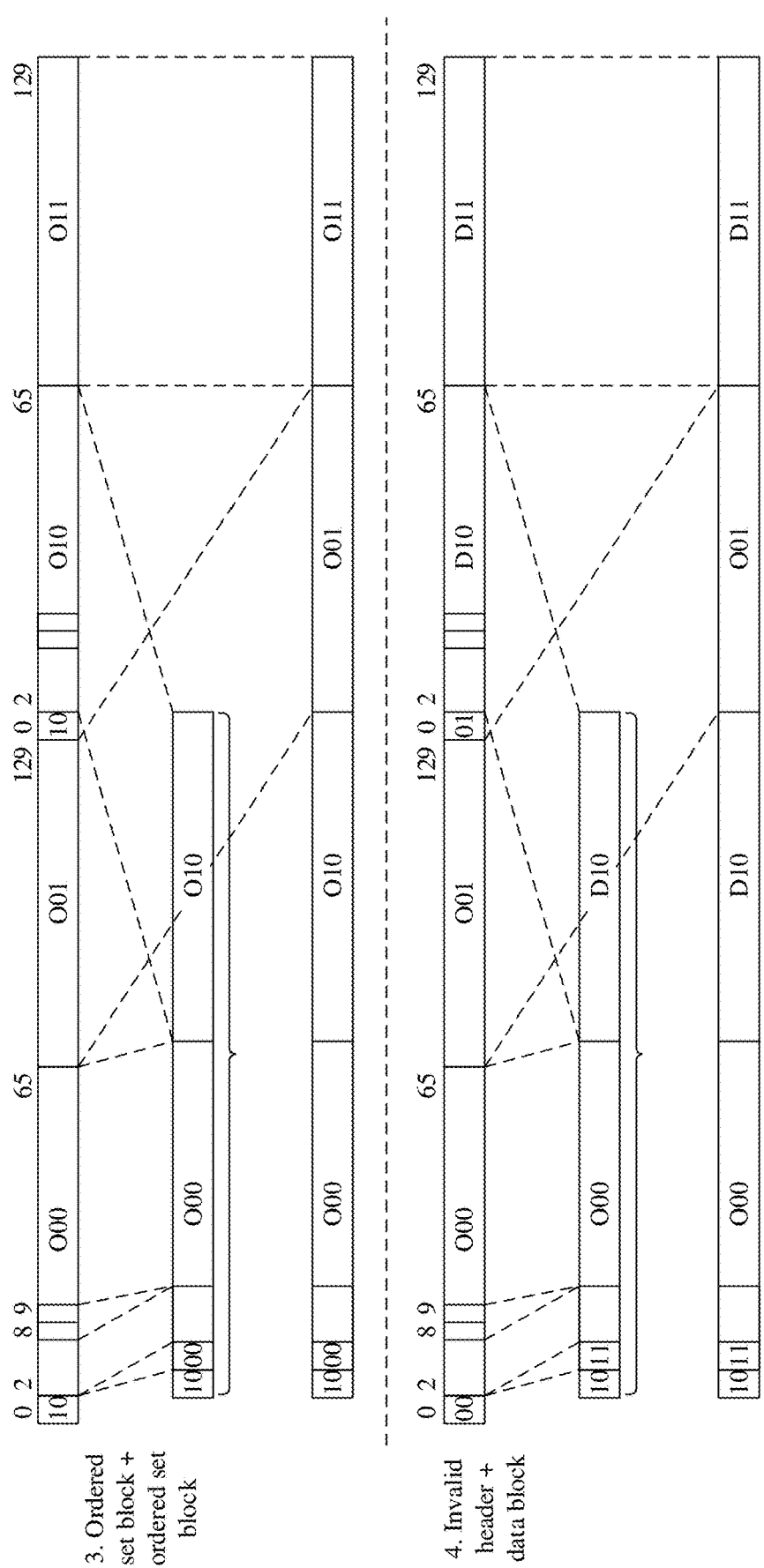

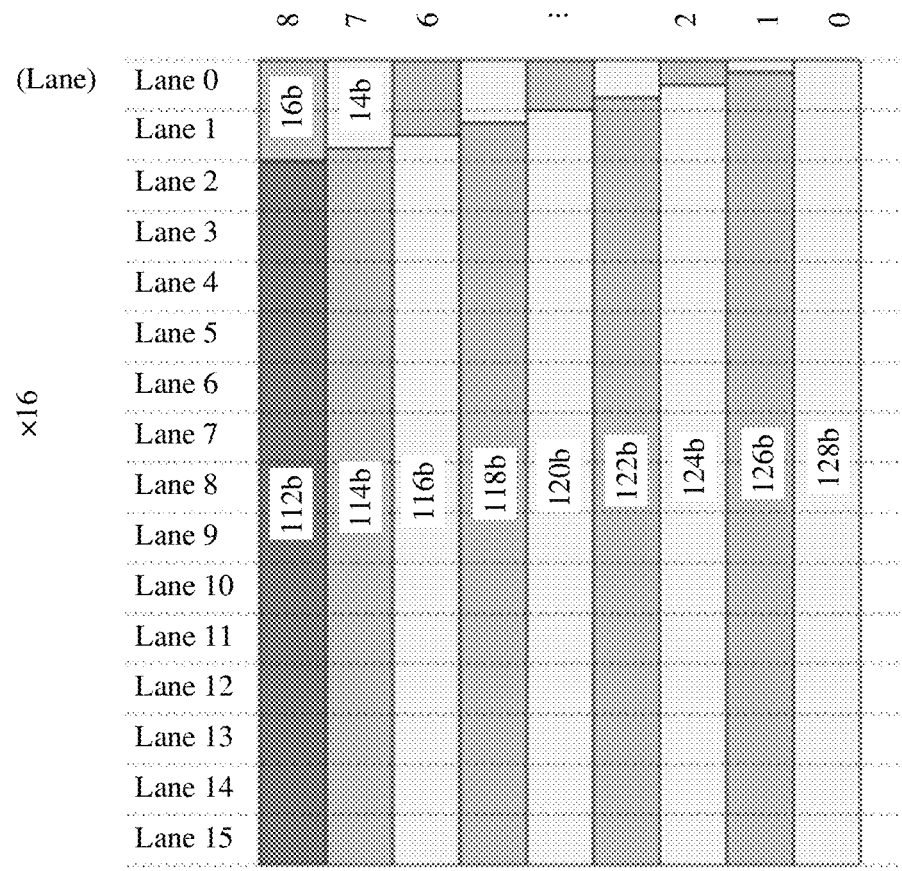
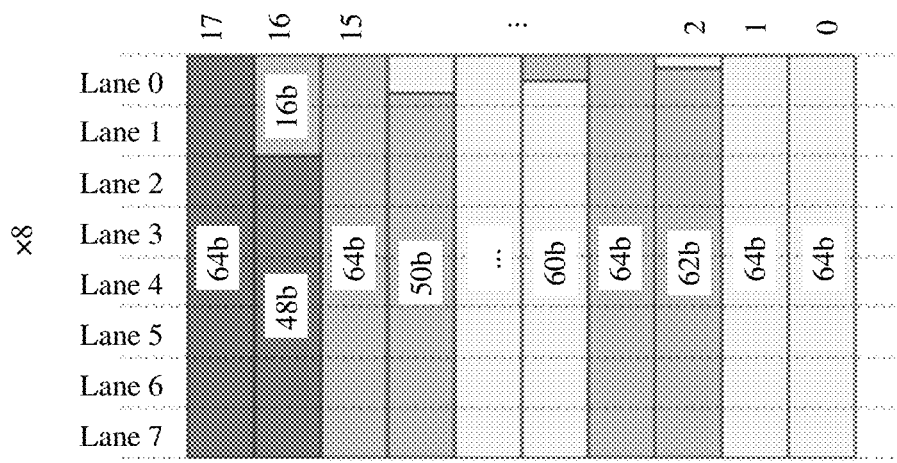
FIG. 14

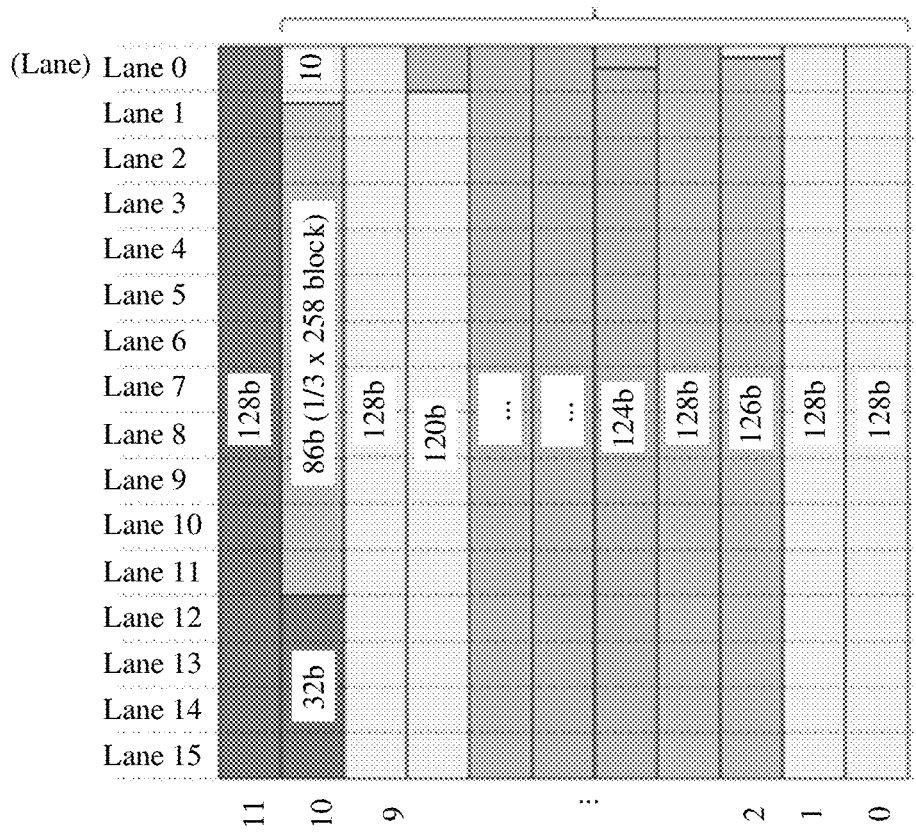
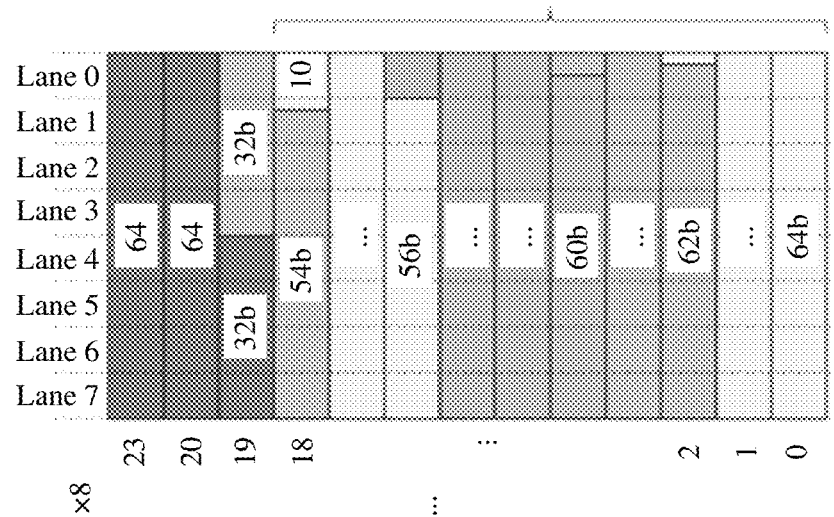
FIG. 15

FIG. 16

ENCODING METHOD AND RELATED DEVICE

CROSS-REFERENCE TO RELATED APPLICATIONS

This application is a continuation of International Application No. PCT/CN2019/087728, filed on May 21, 2019, which claims priority to Chinese Patent Application No. 201810490240.2, filed on May 21, 2018. The disclosures of the aforementioned applications are hereby incorporated by reference in their entireties.

TECHNICAL FIELD

This application relates to the field of network technologies, and in particular, to an encoding method and a related device.

BACKGROUND

With development of information technologies, users have increasing demand for information, and the increasing demand for information leads to continuous increases in rates of interconnection interfaces. For example, in peripheral component interconnect express (PCIE), which is a high-speed serial computer expansion bus standard, an interface rate has been 2.5 GT/s, 5 GT/s, and 8 GT/s since the era of PCIE 1.0, and then been 16 GT/s in latest released PCIE 4.0. In the future, PCIE further evolves to 32 GT/s and 56 GT/s. As the transfer rate increases, a link loss increases. In addition, with the increases in the rates and improvement of processing capabilities, packaging sizes of chips such as a central processing unit (CPU), a graphics processing unit (GPU), and a field-programmable gate array (FPGA) become larger, packaging losses become higher, and optimization is difficult. In the era of 56 G, even if mainboard cabling is not considered, a loss caused by only packaging chips at two ends is very close to a drive capability of a serializer/deserializer (SerDes). Therefore, forward error correction (FEC) needs to be introduced to compensate for the link loss, so as to provide support when there is a higher link loss. However, an FEC codeword in an existing technical solution cannot satisfy a requirement for a low latency and a high gain.

SUMMARY

Embodiments of this application provide an encoding method and a related device, so that an FEC codeword obtained through FEC encoding can satisfy a requirement for a low latency and a high gain.

According to a first aspect, an embodiment of this application provides an encoding method, including: first receiving a to-be-encoded code block whose length is L, where L is a positive integer; and then encoding the to-be-encoded code block to obtain a forward error correction FEC code, where a valid information length K of the FEC code is an integer multiple of a largest prime factor of L, and a total length N of the FEC code is a sum of K and a product of 2 and an error correction capability T of the FEC code.

Through implementation of this embodiment of this application, a short code with low overheads can be obtained through encoding to satisfy a requirement for a low latency, and a long code with a strong error correction capability can be obtained through encoding to satisfy a requirement for a high gain. Therefore, an FEC codeword obtained through FEC encoding can satisfy a requirement for a low latency and a high gain.

In a possible design, a quantity of bits included in each symbol in the FEC code is M, and M is a smallest even number satisfying $(2^M-1) \geq N$.

In another possible design, after a source code block is obtained through encoding based on a 128B/130B encoding scheme, the source code block may be transmitted downward through two paths. A first path is a no transcode path, and the source code block is directly transmitted to a scrambler for scrambling. A second path is a transcode path, the source code block is transcoded to obtain the to-be-encoded code block, and then the to-be-encoded code block is scrambled. The transcode path includes two subpaths. A subpath 1 is a 128B/132B transcode path, and a subpath 2 is a 256B/257B or 256B/258B transcode path.

In another possible design, a source code block is transcoded to obtain the to-be-encoded code block.

In another possible design, a transcoder may receive and transcode a single source code block output by a single encoder, or may receive and transcode a plurality of source code blocks output by a plurality of different encoders.

In another possible design, synchronization header information with at least one bit is added to the single source code block to obtain the to-be-encoded code block, and the synchronization header information is used to indicate a data type of the source code block. An extra frame header with at least one bit is added before each frame of source code block for protection, to effectively reduce a probability of a frame header error.

In another possible design, synchronization header data of each of the plurality of source code blocks is deleted to obtain remaining valid information, and the remaining valid information in the plurality of source code blocks is combined to generate the to-be-encoded code block.

In another possible design, the remaining valid information of each source code block is first divided into two sub-code blocks. Then, the first sub-code blocks in the pairs of sub-code blocks of the plurality of source code blocks are combined to generate a previous part of the to-be-encoded code block, and bit data is added before the previous part of the to-be-encoded code block. Finally, the second sub-code blocks in the pairs of sub-code blocks of the plurality of source code blocks are combined to generate a subsequent part of the to-be-encoded code block.

In another possible design, when the plurality of source code blocks are all data blocks, synchronization header information with at least one bit is added before the previous part of the to-be-encoded code block. The synchronization header information is used to indicate that the plurality of source code blocks are all data blocks.

In another possible design, when the plurality of source code blocks include an ordered set block, synchronization header information with at least one bit is added before the previous part of the to-be-encoded code block, and a hot code with a plurality of bits is added after the synchronization header information. The synchronization header information is used to indicate that the plurality of source code blocks include the ordered set block, and the hot code is used to indicate a data type of each source code block. A plurality of bits are deleted from the first byte of the first ordered set block in the previous part of the to-be-encoded code block.

In another possible design, when the plurality of source code blocks include an invalid source code block, synchronization header information with at least one bit is added before the previous part of the to-be-encoded code block, and a hot code with a plurality of bits is added after the synchronization header information. The hot code is used to indicate that the plurality of source code blocks include at least one invalid source code block. In addition, a plurality of bits are deleted from the first byte of the first source code block in the previous part of the to-be-encoded code block.

In the foregoing optional manners, 128B/132B transcoding can be performed on a source code block output by a 128B/130B encoder, 256B/257B transcoding can be performed on a source code block output by a 128B/130B encoder, and 256B/258B transcoding can be performed on a source code block output by a 128B/130B encoder. Alternatively, corresponding transcoding can be performed on another type of encoding scheme. There are the following beneficial effects.

An extra frame header with at least one bit is added before each frame of source code block for protection by performing 128B/132B transcoding on the source code block output by the 128B/130B encoder, to effectively reduce a probability of a frame header error.

Encoding overheads can be reduced from 1.5625% to 0.4% by performing 256B/257B transcoding on the source code block output by the 128B/130B encoder, so that larger encoding overhead space is provided for FEC encoding. In addition, a 256B/257B transcoding scheme is also applicable to an Ethernet standard. In addition, in a frame format existing after transcoding in this embodiment, a transcode operation is performed for only the first sub-code block of a source code block (130-bit code block). In an application scenario in which there are two or more links, two 130-bit source code blocks are obtained from two different 128B/130B encoders. In a data transmission process, the first sub-code blocks (64 bits) of the two 130-bit source code blocks are first transmitted. Therefore, the frame format existing after transcoding helps complete a transcode operation in the first clock cycle, so that a latency caused by transcoding is effectively reduced.

Encoding overheads can be reduced from 1.5625% to 0.8% by performing 256B/258B transcoding on the source code block output by the 128B/130B encoder, so that larger encoding overhead space is provided for FEC encoding. In addition, in a frame format existing after transcoding in this embodiment, a transcode operation is performed for only the first sub-code block of a source code block (130-bit code block). In an application scenario in which there are two or more links, two 130-bit source code blocks are obtained from two different 128B/130B encoders. In a data transmission process, the first sub-code blocks (64 bits) of the two 130-bit source code blocks are first transmitted. Therefore, the frame format existing after transcoding helps complete a transcode operation in the first clock cycle, so that a latency caused by transcoding is effectively reduced.

In another possible design, synchronization header data of each of the plurality of source code blocks may be deleted to obtain remaining valid information, remaining valid information in the plurality of source code blocks is combined to generate a long code block, and bit data is added before the long code block to obtain the to-be-encoded code block. Finally, a plurality of bits are deleted from the first byte of the first ordered set block in the long code block. In a frame format in transcoding in this embodiment of this application, a source code block does not need to be sliced, but a transcode operation is directly performed on an entire 130-bit source code block. This can provide a frame format reference for the transcode operation.

In another possible design, when the plurality of source code blocks are all data blocks, synchronization header information with at least one bit is added before the long code block. The synchronization header information is used to indicate that the plurality of source code blocks are all data blocks.

In another possible design, when the plurality of source code blocks include an ordered set block, synchronization header information with at least one bit is added before the long code block, and a hot code with a plurality of bits is added after the synchronization header information. The synchronization header information is used to indicate that the plurality of source code blocks include the ordered set block, and the hot code is used to indicate a data type of each source code block. In addition, the plurality of bits are deleted from the first byte of the first ordered set block in a previous part of the to-be-encoded code block.

In another possible design, when the plurality of source code blocks include an invalid source code block, synchronization header information with at least one bit is added before the long code block, and a hot code with a plurality of bits is added after the synchronization header information. The hot code is used to indicate that the plurality of source code blocks include at least one invalid source code block. In addition, a plurality of bits are deleted from the first byte of the first source code block in a plurality of to-be-encoded code blocks.

In another possible design, the source code block is first transcoded to obtain the to-be-encoded code block, then an FEC codeword is designed according to a prime factorization method, and the to-be-encoded code block is encoded to obtain the FEC code.

In another possible design, encoding is performed based on a 128B/130B encoding scheme to obtain the source code block.

In another possible design, after the source code block is obtained through encoding based on the 128B/130B encoding scheme, different to-be-encoded code blocks may be obtained based on a transcoding scheme or a non-transcoding scheme. A preferred transcoding scheme in this embodiment of this application includes a 256B/258B transcoding scheme or a 128B/132B transcoding scheme.

In another possible design, when L=258, N=192, K=172, T=10, and M=8; or N=184, K=172, T=6, and M=8; or N=96, K=86, T=5, and M=8.

In another possible design, when L=132, N=136, K=132, T=2, and M=8; or N=144, K=132, T=6, and M=8; or N=152, K=132, T=10, and M=8; or N=72, K=66, T=3, and M=8.

In another possible design, when L=130, N=136, K=130, T=3, and M=8; or N=144, K=130, T=7, and M=8; or N=152, K=130, T=11, and M=8.

In another possible design, in an application scenario with a long distance, a high loss, and a low latency requirement, a long code such as RS (272, 258, T=7) or RS (544, 514, T=15) may be preferentially selected. In an application scenario with a short distance, a low loss, and a high latency requirement, a short code such as RS (144, 132, T=6), RS (144, 130, T=7), RS (192, 172, T=10), or RS (72, 66, T=3) may be preferentially selected.

In another possible design, the FEC code is distributed to a plurality of physical layer lanes for sending.

In another possible design, the FEC code may be sequentially distributed to the plurality of physical layer lanes in a form of symbols, and one symbol is distributed to each lane each time. After one symbol is distributed to each of all the physical layer lanes, a new round of distribution is started. A quantity of symbols in the FEC code that are distributed to each physical layer lane is a ratio of a total quantity of symbols of a codeword of the FEC code to a quantity of the plurality of physical layer lanes. This manner is applied to an application scenario in which a single FEC codeword output by one FEC encoder is distributed to different physical layer lanes, and a data distribution solution is provided for a multi-lane transmission scenario.

In another possible design, a plurality of FEC codes may be interleaved and mapped to a gearbox in a form of symbols. A quantity of columns of the gearbox is a quantity of the plurality of physical layer lanes. Then, FEC codes in the gearbox are sequentially distributed to the plurality of physical layer lanes. This manner is applied to an application scenario in which a plurality of FEC codewords output by a plurality of FEC encoders are distributed to different physical layer lanes, and a data distribution solution is provided for a multi-lane transmission scenario.

In another possible design, after the FEC code is obtained by encoding the to-be-encoded code block, a plurality of dummy bits may be added to the FEC code. A quantity of symbols in the FEC code may match a quantity of physical layer lanes by adding the dummy bits. In this way, a design of a gearbox can be simplified in a process of distributing the FEC code to the plurality of physical layer lanes, and an optimization effect can be achieved.

According to a second aspect, an embodiment of this application provides an encoding apparatus. The encoding apparatus is configured to implement the method and the function that are performed by an FEC encoder in the first aspect, and is implemented by hardware/software. The hardware/software of the encoding apparatus includes a unit corresponding to the foregoing function.

According to a third aspect, this application provides an encoding device, including a processor, a memory, and a communications bus. The communications bus is configured to implement connection and communication between the processor and the memory, and the processor executes a program stored in the memory to implement the steps in the encoding method provided in the first aspect.

In a possible design, the encoding device provided in this application may include a corresponding module configured to perform behavior of the encoding apparatus in the foregoing method design. The module may be software and/or hardware.

According to a fourth aspect, this application provides a computer-readable storage medium. The computer-readable storage medium stores an instruction, and when the instruction is run on a computer, the computer is enabled to perform the method in the foregoing aspects.

According to a fifth aspect, this application provides a computer program product including an instruction. When the computer program product is run on a computer, the computer is enabled to perform the method in the foregoing aspects.

BRIEF DESCRIPTION OF THE DRAWINGS

FIG. 9A and FIG. 9B are a schematic diagram of transcoding of two frames of 130-bit source code blocks according to an embodiment of this application;

FIG. 11A and FIG. 11B are a schematic diagram of another type of transcoding of two frames of 130-bit source code blocks according to an embodiment of this application;

FIG. 14 is a schematic diagram of FEC code distribution according to an embodiment of this application;

FIG. 15 is a schematic diagram of another type of FEC code distribution according to an embodiment of this application;

FIG. 16 is a schematic diagram of still another type of FEC code distribution according to an embodiment of this application;

DETAILED DESCRIPTION OF ILLUSTRATIVE EMBODIMENTS

The following describes the embodiments of this application with reference to the accompanying drawings in the embodiments of this application.

Figure 1:
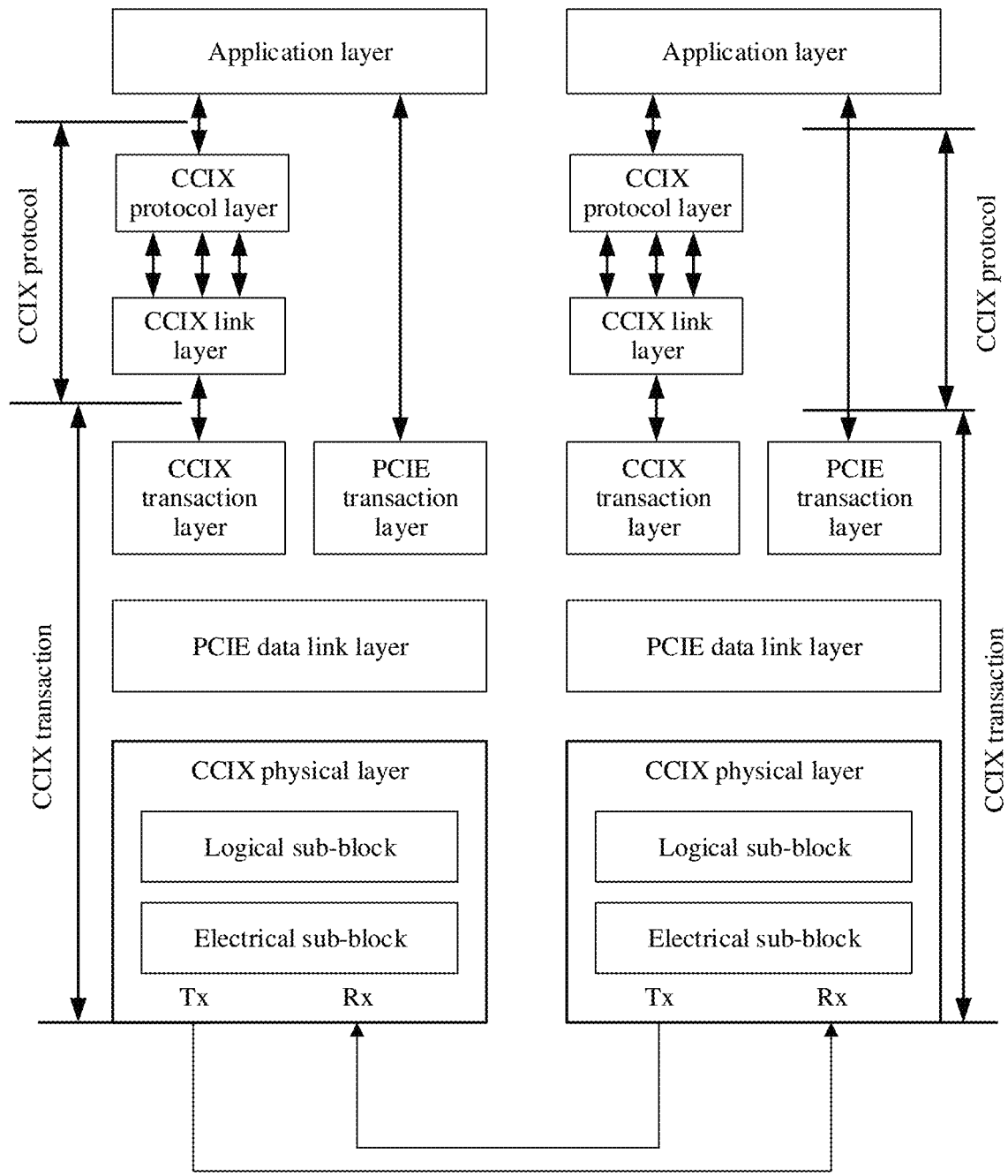
FIG. 1 is a schematic architectural diagram of a CCIX standard system according to an embodiment of this application.

FIG. 1 is a schematic architectural diagram of a cache coherent interconnect for accelerators (CCIX) standard system according to an embodiment of this application. The CCIX standard system is an interconnection manner based on a PCIE architecture. The CCIX standard system sequentially includes an application layer and each upper layer, a CCIX protocol layer, a CCIX link layer, a CCIX transaction layer, a PCIE transaction layer, a PCIE data link layer, and a CCIX physical layer from top to bottom. The CCIX physical layer includes two sub-blocks: a logical sub-block and an electrical sub-block.

For the PCIE architecture and the CCIX architecture, a link loss occurs when an interface rate increases. In a PCIE application scenario and a CCIX application scenario, an interconnection distance is relatively short, and a system has a relatively high latency requirement. After the interface rate increases and FEC is introduced, if an FEC latency is relatively high, an increase in a total amount of data that can be transmitted within a same time period is limited. Therefore, a relatively high requirement is imposed on the FEC latency after the FEC is introduced. In an existing technical solution, the following FEC design solution is provided.

Figure 2:
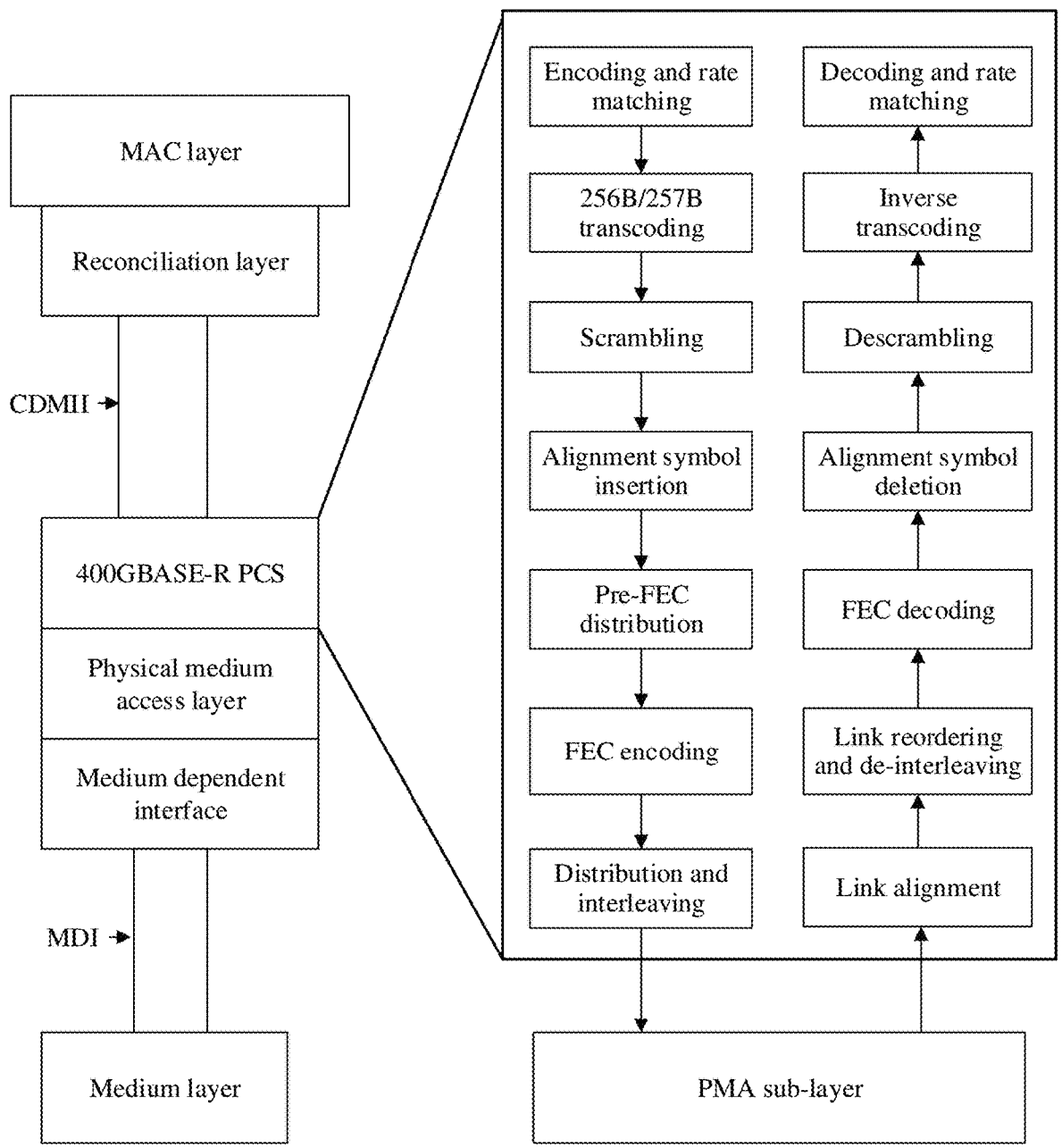
FIG. 2 is a schematic structural diagram of a 400GE Ethernet standard according to an embodiment of this application.

FIG. 2 is a schematic structural diagram of a 400GE Ethernet standard according to an embodiment of this application. A right part of the schematic diagram is a detailed block diagram corresponding to a physical coding sublayer (PCS) at a physical layer. In a solution of the standard, at the physical layer, a 64B/66B encoding scheme is first used for encoding, and then a 256B/257B transcoding scheme is used for transcoding. Based on the transcoding scheme, an FEC codeword KP4-RS (544, 514) designed based on a 257-bit code block length is provided. RS is a Reed-Solomon codeword. However, a decoding latency of an RS (544, 514) codeword used in the 400GE Ethernet interface standard reaches about 100 nanoseconds, and the latency is relatively high. Therefore, the RS (544, 514) codeword is not applicable to an application scenario in which there is a relatively high latency requirement.

Figure 3:
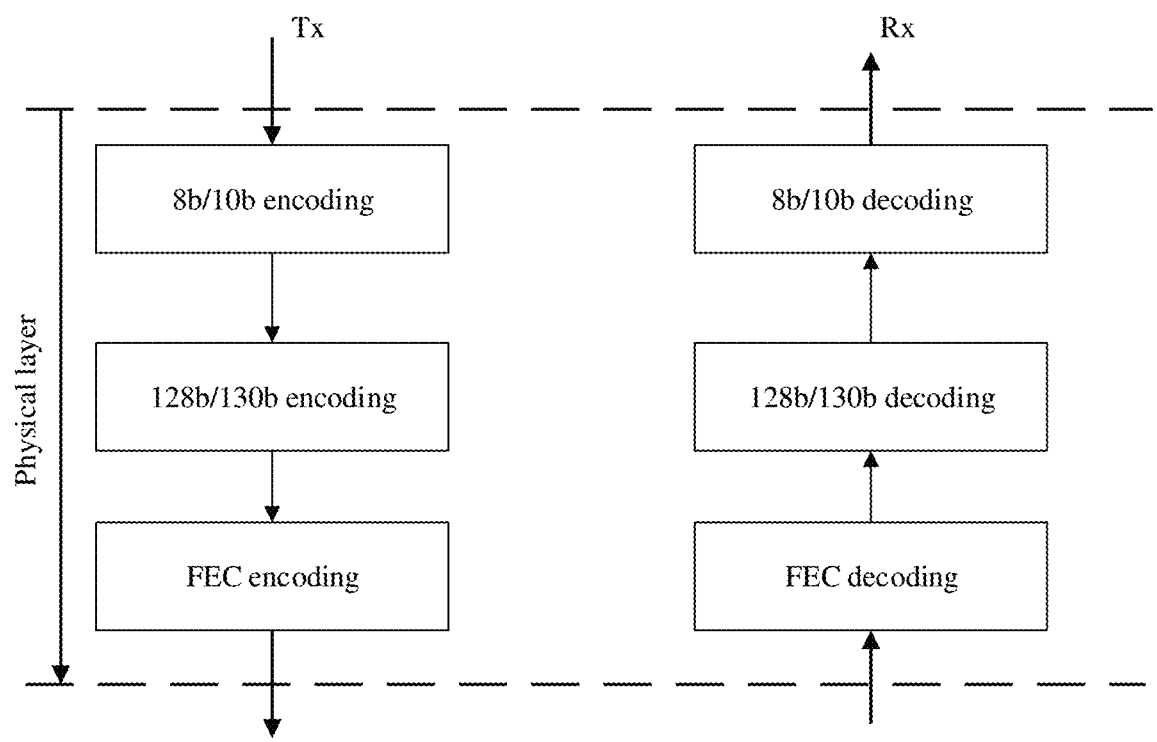
FIG. 3 is a schematic structural diagram of a physical layer coding architecture according to an embodiment of this application.

FIG. 3 is a schematic structural diagram of a physical layer coding architecture according to an embodiment of this application. The physical layer coding architecture is a physical layer coding architecture corresponding to the serial attached small computer system interface (Serial Attached SCSI 4, SAS-4) standard. A link rate can reach 22.5 Gbps. FEC is introduced at a physical layer to compensate for a link loss. In the SAS standard, an 8B/10B encoding scheme is first used for encoding, then a 128B/130B encoding scheme is used for encoding, and finally FEC encoding is performed. For FEC codeword selection, RS (30, 26) corresponding to a 130-bit code block length is selected in SAS-4. Although the 128B/130B encoding scheme used in SAS-4 is the same as that used in CCIX, PCIE 3.0, and a higher standard, a net coding gain (NCG) of the FEC codeword selected in SAS-4 is only 3.46 dB, which is far lower than a gain level of KP4-RS (544, 514). Therefore, the FEC codeword cannot be applied to an application scenario in which a link loss is relatively high.

In conclusion, there is no FEC in an existing CCIX architecture and PCIE architecture. As a rate in CCIX and PCIE increases (for example, to 56 Gbps or a higher rate), a link loss increases, and FEC needs to be introduced for gain compensation. CCIX and PCIE are latency-sensitive systems. After FEC is introduced, there is a relatively high requirement on an FEC decoding latency. In addition, after an interface rate in CCIX and PCIE increases and FEC is introduced, a gain requirement on FEC is close to that on KP4. An FEC codeword in an existing technical solution cannot satisfy a requirement for both a low latency and a high gain. For the foregoing technical problem, the embodiments of this application provide the following solutions.

Figure 4A:
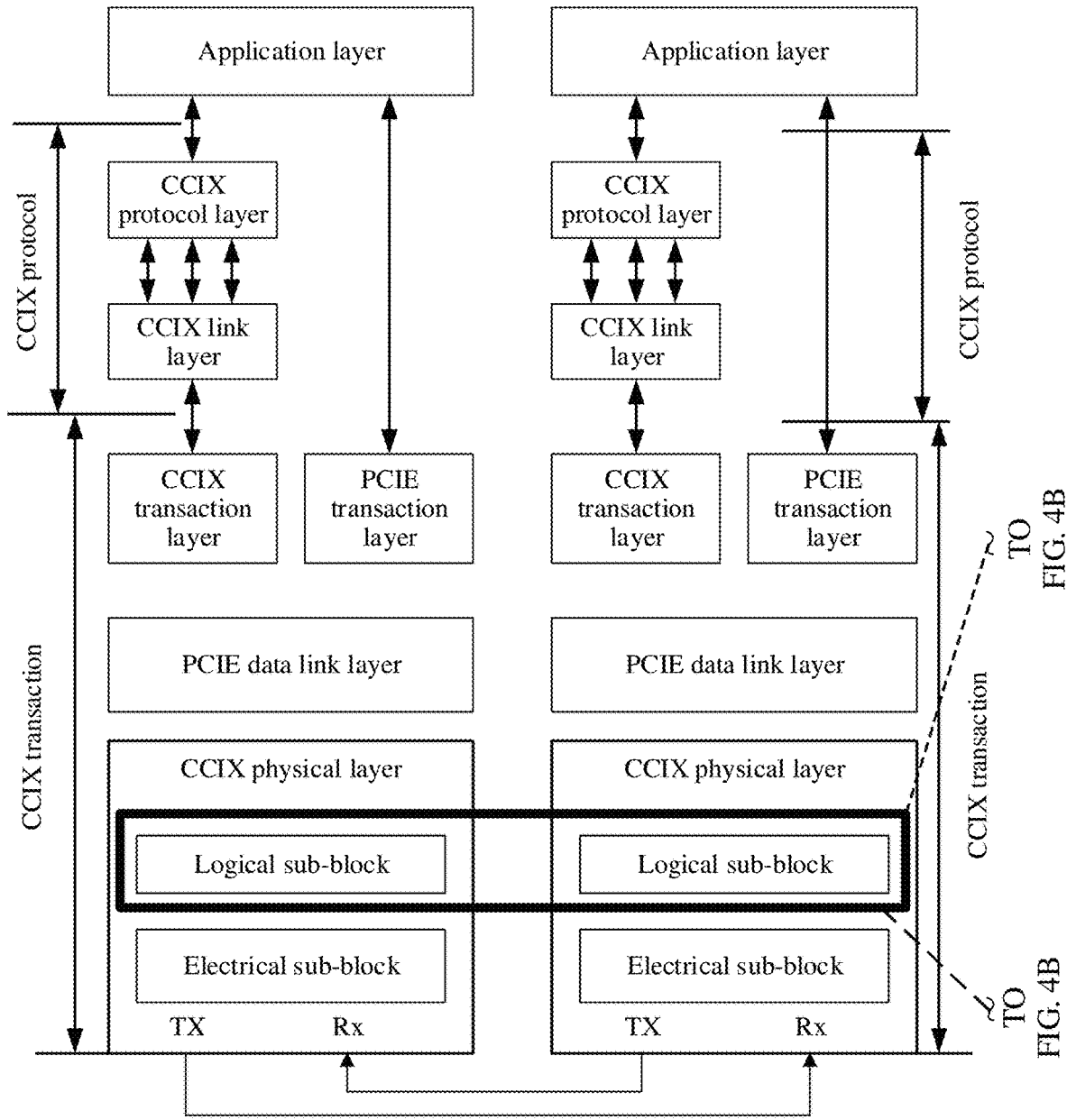
FIG. 4A and FIG. 4B are a schematic structural diagram of a high-speed interface physical layer coding system according to an embodiment of this application.
Figure 4B:
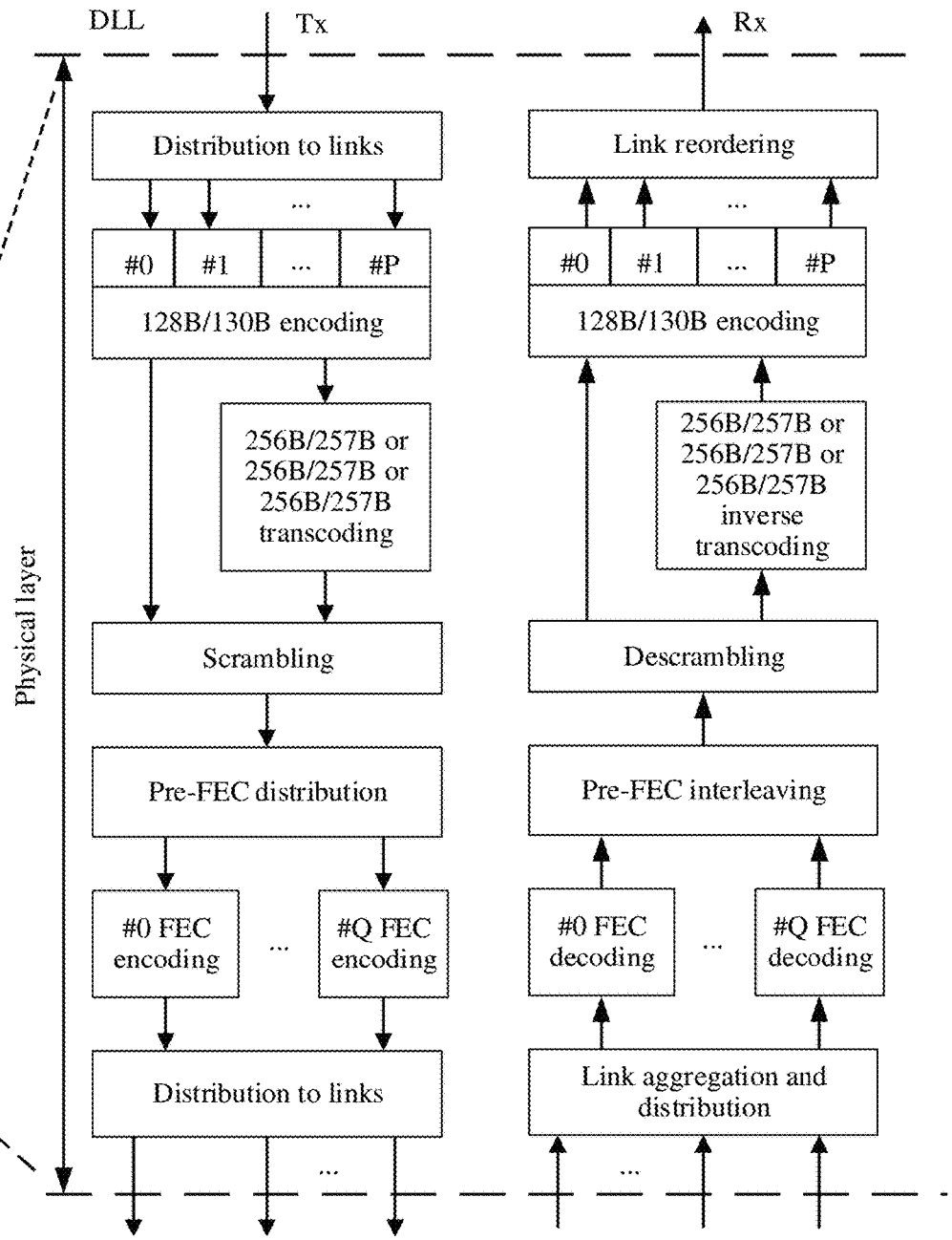

FIG. 4A and FIG. 4B are a schematic structural diagram of a high-speed interface physical layer coding system according to an embodiment of this application. Main application scenarios of this application are CCIX and PCIE. FIG. 4A and FIG. 4B are a schematic architectural diagram of an overall system in the scenarios. A left side is an overall architecture in CCIX/PCIE. The architecture includes an application layer and each upper layer, a CCIX protocol layer, a CCIX link layer, a CCIX transaction layer, a PCIE transaction layer, a PCIE data link layer, and a CCIX physical layer. The physical layer includes two sub-blocks: a logical sub-block and an electrical sub-block. The embodiments of this application provide an encoding method for the logical sub-block at the physical layer in the architecture. A right side is a schematic diagram of a high-speed interface physical layer encoding method on the logical sub-block. There are mainly steps such as encoding, transcoding, scrambling, FEC encoding, and sending on a sending side from top to bottom. There are mainly steps such as receiving, FEC decoding, descrambling, inverse transcoding, and link reordering on a receiving side from bottom to top. Because a principle of the sending side is the same as that of the receiving side, only an encoding method on the sending side is described in the embodiments of this application.

Figure 5:
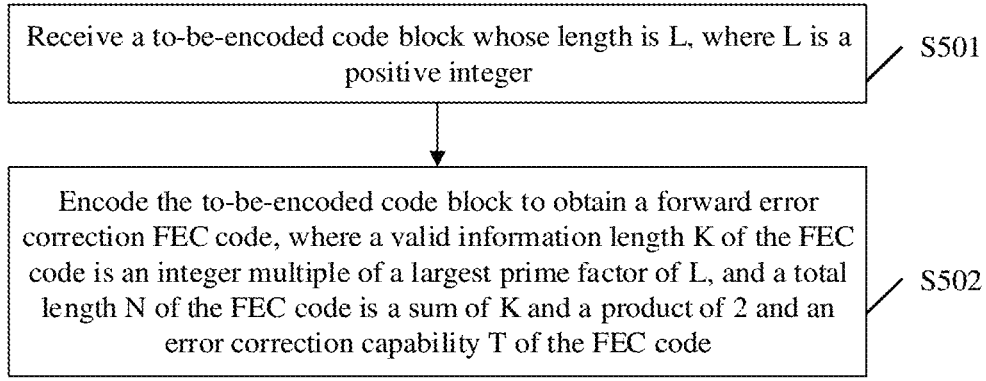
FIG. 5 is a schematic flowchart of an FEC encoding method according to an embodiment of this application.

For FEC encoding in the foregoing system, an embodiment of this application provides an FEC encoding method. FIG. 5 is a schematic flowchart of an FEC encoding method according to an embodiment of this application. The method includes the following steps.

S501: Receive a to-be-encoded code block whose length is L, where L is a positive integer. L is in a unit of bit. One or more to-be-encoded code blocks may be received, and "more" may be an integer quantity or a non-integer quantity. A quantity of to-be-encoded code blocks may be determined based on a valid information length of an FEC code obtained through encoding. For example, when the to-be-encoded code block is a 256B/258B code block, L=258 bits. When the to-be-encoded code block is a 128B/132B code block, L=132 bits.

S502: Encode the to-be-encoded code block to obtain a forward error correction FEC code, where a valid information length K of the FEC code is an integer multiple of a largest prime factor of L, and a total length N of the FEC code is a sum of K and a product of 2 and an error correction capability T of the FEC code. A quantity M of bits included in each symbol in the FEC code is determined by N, and M may be a positive integer satisfying $(2^M-1) \geq N$. Optionally, M may alternatively be a smallest even number satisfying $(2^M-1) \geq N$. The FEC codeword is in a form of symbols. K is the valid information length of the FEC code. N is the total length of the FEC code. To be specific, N represents a total quantity of symbols output by an FEC encoder. T represents a quantity of symbols whose errors can be corrected by using the FEC code. M is the quantity of bits included in each symbol. A Reed-Solomon (RS) code is used as an example. A representation manner of the Reed-Solomon code is RS (N, K, T, M). For example, RS (N, K, T, M) is RS (544, 514, 15, 10), a total length N of the FEC code is 544 symbols, a valid information length K is 514 symbols, an error correction capability T is 15 symbols, and each symbol includes 10 bits. The FEC code in this embodiment of this application may also be referred to as an FEC codeword.

Through implementation of this embodiment of this application, a short code with low overheads can be obtained through encoding to satisfy a requirement for a low latency, and a long code with a strong error correction capability can be obtained through encoding to satisfy a requirement for a high gain. Therefore, an FEC codeword obtained through FEC encoding can satisfy a requirement for a low latency and a high gain.

For example, in a 128B/130B encoding scheme, the FEC encoder receives a to-be-encoded code block with a length L=130 bits, and performs prime factorization on 130: 130=13×5×2. A valid information length K of an FEC code is designed based on the largest prime factor P=13. An integral multiple of P is selected as K. In other words, K=a×13, where a=1, 2, 3 . . . . An error correction capability T=1, 2, 3 . . . . A total length of the FEC code is N=K+2T. In the FEC code, M may be determined by N, and M may be a smallest even number satisfying $(2^M-1) \geq N$, for example, 6, 8, 10 . . . . RS (144, 130, T=7) is used as an example, and a preferred value of M is 8.

It should be noted that this embodiment of this application provides a corresponding FEC codeword design method with reference to the 128B/130B encoding scheme, and provides codeword selection for CCIX and PCIE in a 128B/130B encoding scenario. According to a prime factorization method, prime factorization is performed on a length 130 of an encoded code block, and a codeword is designed based on a largest prime factor, so that a design of a gearbox (Gearbox) can be simplified in an FEC codeword receiving process.

Figure 6:
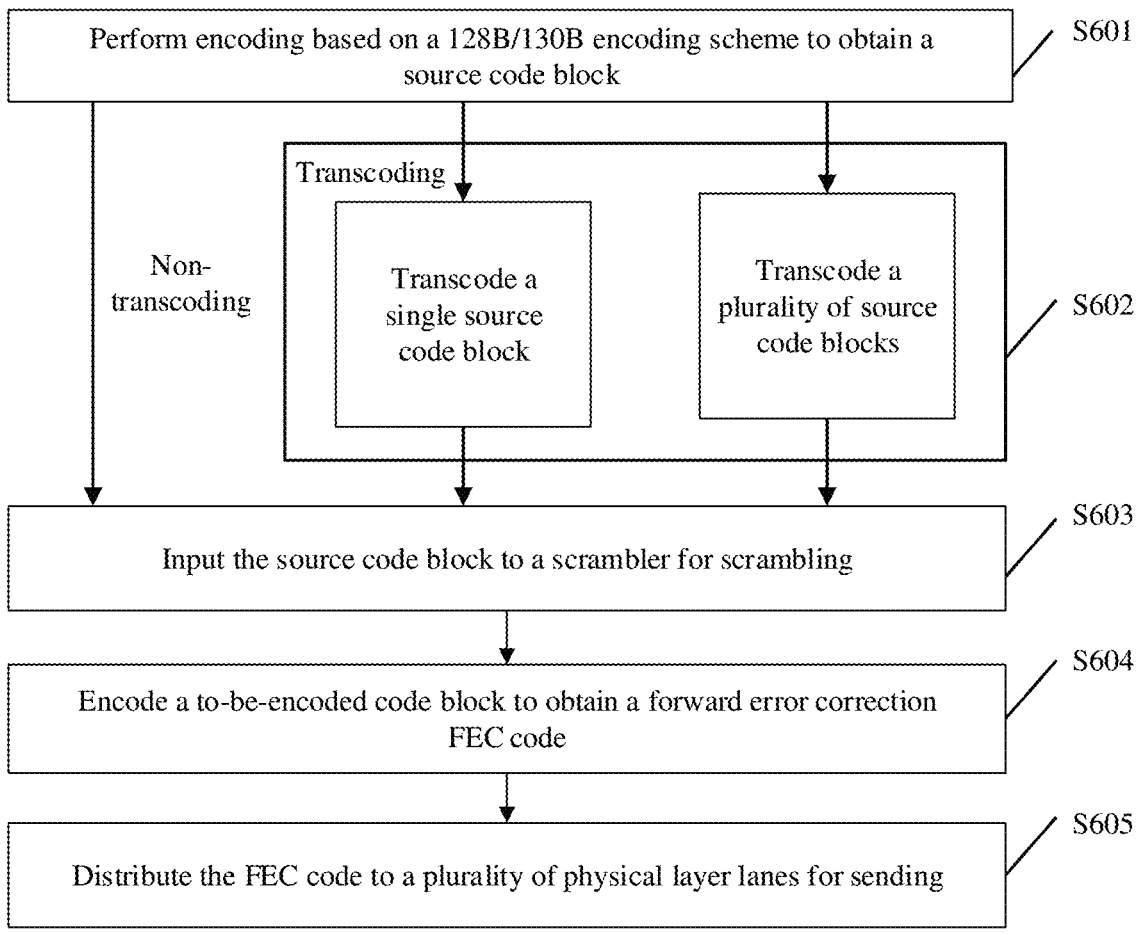
FIG. 6 is a schematic flowchart of an encoding method according to an embodiment of this application.

FIG. 6 is a schematic flowchart of an encoding method according to an embodiment of this application. This embodiment of this application provides an overall description of physical layer encoding with reference to the FEC encoding in the foregoing embodiment. The physical layer encoding is an example. The encoding method may also be used in another case. The encoding method in this embodiment of this application includes at least the following steps.

S601: Perform encoding based on a 128B/130B encoding scheme to obtain the source code block.

In specific implementation, as shown in FIG. 4A and FIG. 4B, a physical layer includes a plurality of different 128/130 encoders such as an encoder #1, an encoder #1, . . . , and an encoder #P. The physical layer first receives data delivered by a data link layer (Data Link Layer, DLL), groups the received data by bytes (each byte includes 8 bits), and distributes each byte to a different encoder. For example, a byte 0, a byte 1, a byte 2, a byte 3, . . . , and the like are sequentially received from the DLL layer. During distribution to links, the received bytes are sequentially distributed to different links. Each link corresponds to one encoder. The byte 0 is distributed to a link 0 (corresponding to the encoder #0), and therefore, the byte 0 is distributed to the encoder 0. The byte 1 is distributed to a link 1 (corresponding to the encoder #1), and therefore, the byte 1 is distributed to the encoder #1. After 128-bit information is received on each link, 2-bit synchronization header information is added, to generate a 130-bit code block. Different encoders may output different source code blocks. The encoder in this embodiment of this application performs encoding mainly based on the 128B/130B encoding scheme, but may also perform encoding based on another encoding scheme.

It should be noted that, after the source code block is obtained through encoding based on the 128B/130B encoding scheme, the source code block may be transmitted downward through two paths. A first path is a no transcode (NTC) path, S603 is performed, and the source code block is directly transmitted to a scrambler for scrambling. A second path is a transcode (TC) path, S602 is performed, the source code block is transcoded to obtain a to-be-encoded code block, and then the to-be-encoded code block is scrambled. The transcode path includes two subpaths. A subpath 1 is used to transcode a single source code block, and a subpath 2 is used to transcode a plurality of source code blocks. For example, on the subpath 1, one frame of 130-bit source code block is received from a single 128B/130B encoder, and a 132-bit to-be-encoded code block is generated through a 128B/132B transcoder. On the subpath 2, two frames of 130-bit source code blocks are received from different 128B/130B encoders, and the two frames of 130-bit source code blocks are input into a 256B/257B or 256B/258B transcoder, to generate a 257-bit or 258-bit to-be-encoded code block.

S602: Transcode the source code block to obtain the to-be-encoded code block.

In specific implementation, a transcoder may receive and transcode a single source code block output by a single encoder, or may receive and transcode a plurality of source code blocks output by a plurality of different encoders. There are the following optional transcoding schemes.

In a first optional scheme, synchronization header information with at least one bit may be added to the single source code block to obtain the to-be-encoded code block, and the synchronization header information is used to indicate a data type of the source code block. An extra frame header with at least one bit is added before each frame of source code block for protection, to effectively reduce a probability of a frame header error.

Figure 7:
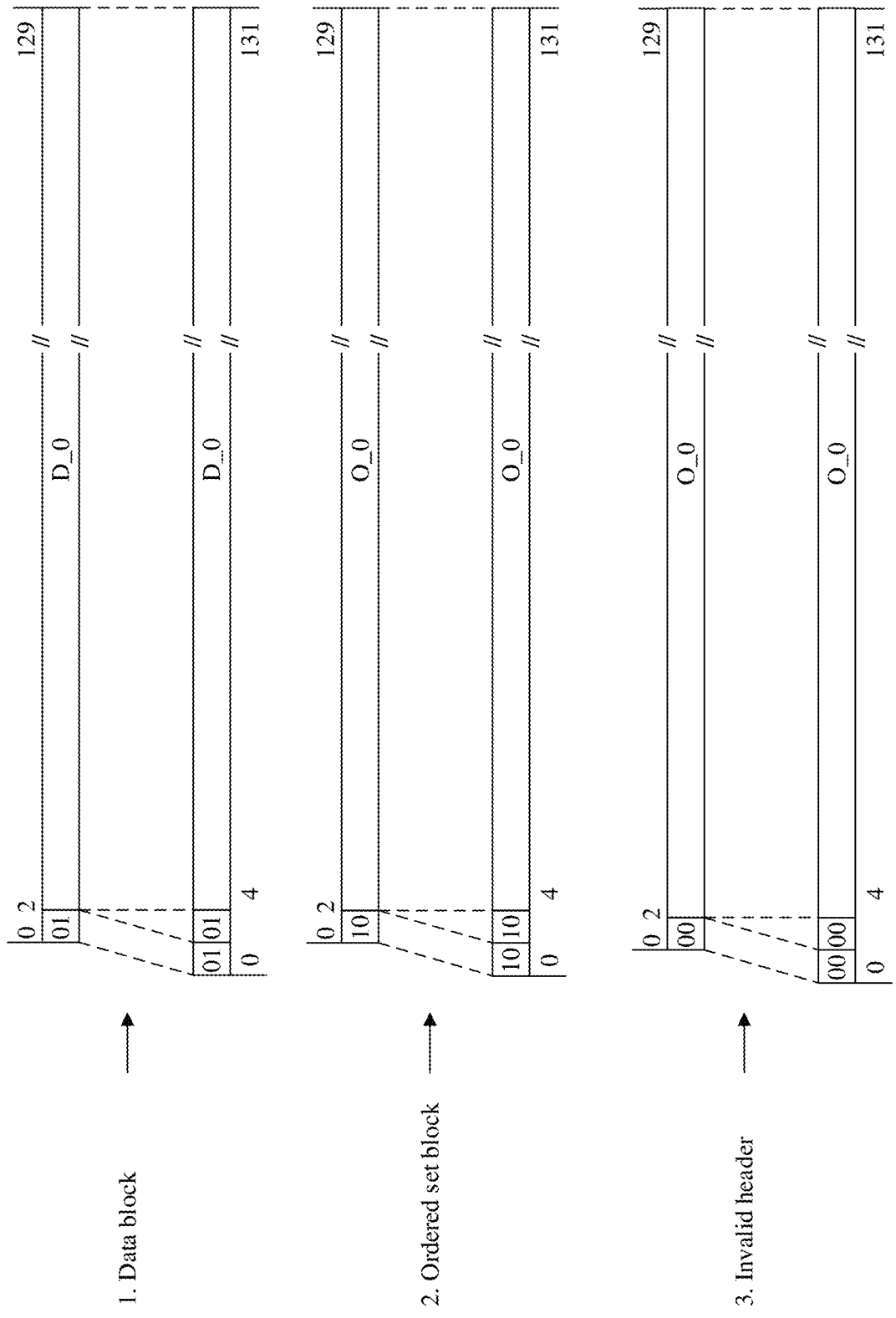
FIG. 7 is a schematic diagram of transcoding of one frame of 130-bit source code block according to an embodiment of this application.

For example, FIG. 7 is a schematic diagram of transcoding of one frame of 130-bit source code block according to an embodiment of this application. One frame of 130-bit source code block is received from a single 128B/130B encoder, and a 128B/132B transcode operation is performed on the source code block. A format of the 130-bit source code block is first retained, and then 2-bit synchronization header information is added before the 130-bit source code block. For example, $H_0H_1$ represents the 2-bit synchronization header information. The bit $H_0$ is a least significant bit (LSB), and the bit $H_1$ is a most significant bit (MSB). Then, the source code block is transcoded into a 132-bit to-be-encoded code block. When a data type of the received source code block is a data block, 2-bit synchronization header information is added, for example, $H_0H_1=01$. When a data type of the received source code block is an ordered set block, 2-bit synchronization header information is added, for example, $H_0H_1=10$. When a data type of the received source code block is an invalid header, 2-bit synchronization header information is added, for example, $H_0H_1=00$. The added synchronization header information may be the same as synchronization header data of the source code block.

In a second optional scheme, synchronization header data of each of the plurality of source code blocks may be first deleted to obtain remaining valid information, and the remaining valid information in the plurality of source code blocks is combined to generate the to-be-encoded code block. The remaining valid information is a code block obtained after the synchronization header data is deleted. Further, the remaining valid information of each source code block may be divided into two sub-code blocks. Then, the first sub-code blocks in the pairs of sub-code blocks of the plurality of source code blocks are combined to generate a previous part of the to-be-encoded code block, and bit data is added before the previous part of the to-be-encoded code block. The bit data may include synchronization header information or a hot code. When the plurality of source code blocks are all data blocks, synchronization header information with at least one bit is added before the previous part of the to-be-encoded code block. The synchronization header information is used to indicate that the plurality of source code blocks are all data blocks. When the plurality of source code blocks include an ordered set block, synchronization header information with at least one bit is added before the previous part of the to-be-encoded code block, and a hot code with a plurality of bits is added after the synchronization header information. The synchronization header information is used to indicate that the plurality of source code blocks include the ordered set block, and the hot code is used to indicate a data type of each source code block. A plurality of bits are deleted from the first byte of the first ordered set block in the previous part of the to-be-encoded code block. Finally, the second sub-code blocks in the pairs of sub-code blocks of the plurality of source code blocks are combined to generate a subsequent part of the to-be-encoded code block.

It should be noted that the remaining valid information of each source code block may be divided into X sub-code blocks, and X may be a positive integer such as 3, 4, or 5. Then, the first sub-code block in the first source code block, the first sub-code block in the second source code block, . . . , and the first sub-code block in the $Y^{th}$ source code block are combined to generate a first part of the to-be-encoded code block. The second sub-code block in the first source code block, the second sub-code block in the second source code block, . . . , and the second sub-code block in the $Y^{th}$ source code block are combined to generate a second part of the to-be-encoded code block. The third sub-code block in the first source code block, the third sub-code block in the second source code block, . . . , and the third sub-code block in the $Y^{th}$ source code block are combined to generate a third part of the to-be-encoded code block. Other parts are obtained through transcoding according to the same method. Y is a positive integer.

Figure 8:
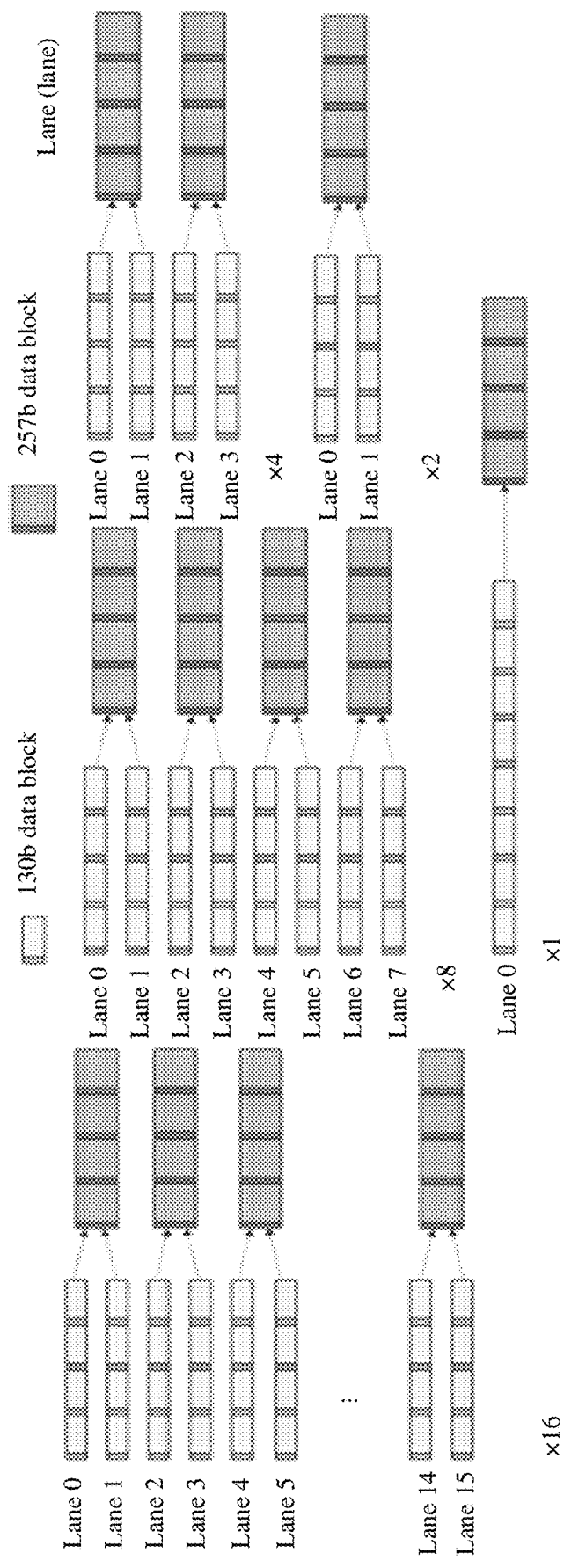
FIG. 8 is a schematic diagram of a mapping relationship between a 130-bit source code block and a 257-bit to-be-encoded code block according to an embodiment of this application.

For example, FIG. 8 is a schematic diagram of a mapping relationship between a 130-bit source code block and a 257-bit to-be-encoded code block according to an embodiment of this application. In a system including a plurality of 128B/130B encoders, two frames of 130-bit source code blocks may be received from two different 128B/130B encoders, and a 256B/257B transcode operation is performed on the two frames of 130-bit source code blocks, to obtain a 257-bit to-be-encoded code block.

Figure 9B:
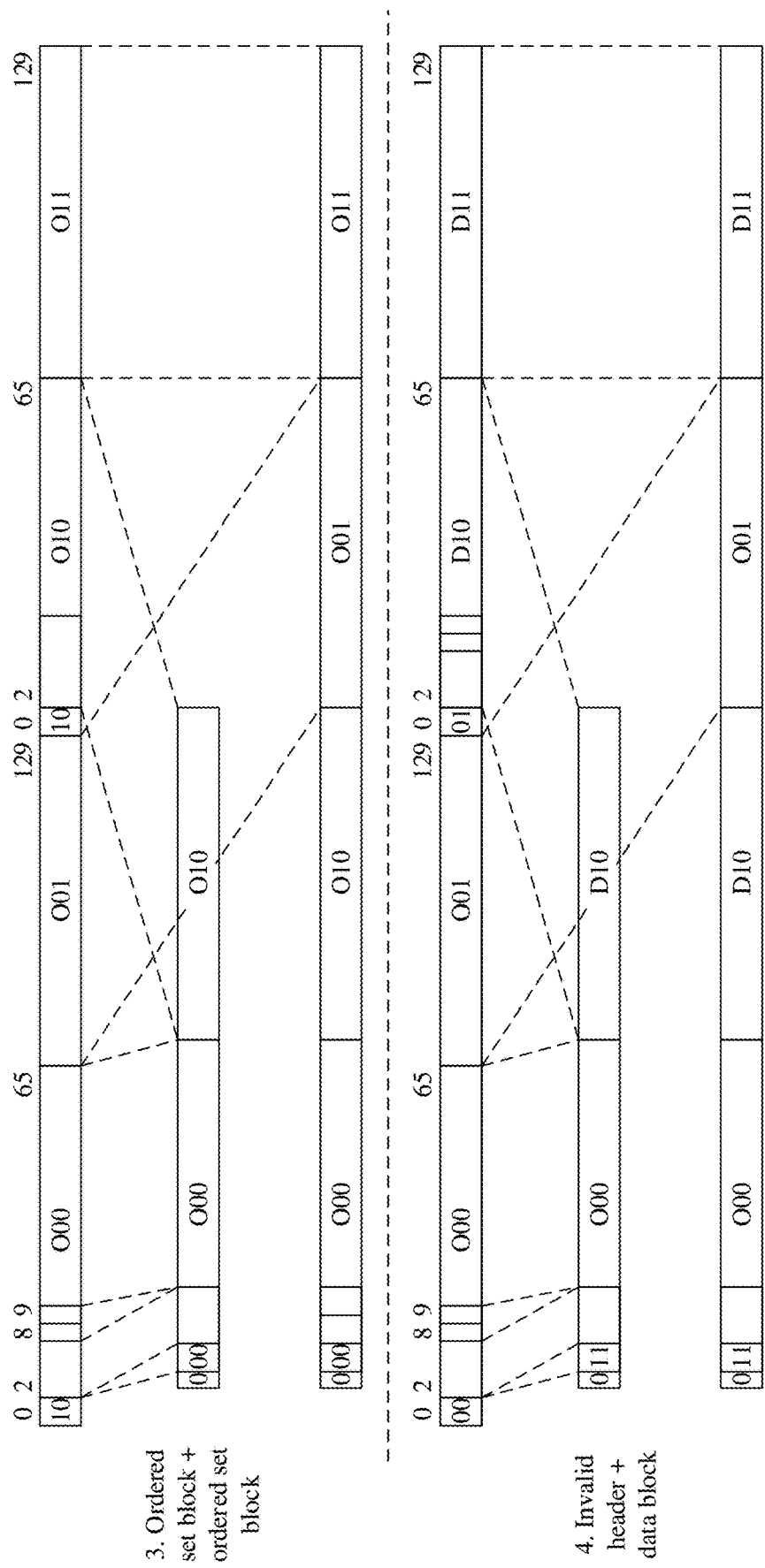

FIG. 9A and FIG. 9B are a schematic diagram of transcoding of two frames of 130-bit source code blocks according to an embodiment of this application. The source code blocks are received from two different 128B/130B encoders. It is assumed that a bit width of data transmission is 64 bits. 2-bit synchronization header data in the 130-bit source code block is deleted. A length of remaining valid information is 128 bits, and the remaining valid information is divided into two 64-bit sub-code blocks. As shown in (All data block) in FIG. 9A and FIG. 9B, the first frame of source code block D0 is divided into D00 and D01, the second frame of source code block D1 is divided into D10 and D11, and the first sub-code block D00 in the first frame of source code block D0 and the first sub-code block D10 in the second frame of source code block D1 are combined to generate a previous part (D00 and D10) of a to-be-encoded code block. Because the received two frames of data are all data blocks (Data Block), 1-bit synchronization header information (for example, 1) may be added before the previous part of the to-be-encoded code block. In addition, the first sub-code block D01 in the first frame of source code block D0 and the first sub-code block D11 in the second frame of source code block D1 are combined to generate a subsequent part (D01 and D11) of the to-be-encoded code block. Finally, the previous part and the subsequent part are combined to generate the 257-bit to-be-encoded code block. As shown in (Ordered set block+data block) in FIG. 9A and FIG. 9B, the first frame of source code block is an ordered set block, the second frame of source code block is a data block, the first frame of source code block O0 is divided into O00 and O01, the second frame of source code block D1 is divided into D10 and D11, and the first sub-code block O00 in the first frame of source code block O0 and the first sub-code block D10 in the second frame of source code block D1 are combined to generate a previous part (O00 and D10) of a to-be-encoded code block. Because the received two frames of data include the ordered set block and the data block, 1-bit synchronization header information (for example, 0) may be added before the previous part of the to-be-encoded code block, and a 2-bit hot code (for example, 01) is added after the synchronization header information, to indicate data types of the received two frames of data. Herein, 0 represents the ordered set block, and 1 represents the data block. In addition, two bits are correspondingly deleted from the first byte of the first ordered set block in the previous part of the to-be-encoded code block. The first byte is used to indicate a type of the ordered set block, and the two deleted bits may be two most significant bits in the first byte of the first ordered set block, or may be two least significant bits in the first byte of the first ordered set block. In addition, the first sub-code block O01 in the first frame of source code block O0 and the first sub-code block D11 in the second frame of source code block D1 are combined to generate a subsequent part (O01 and D11) of the to-be-encoded code block. Finally, the 257-bit to-be-encoded code block is generated. Another combination including the ordered set block type is similar, and details are not described herein. If a source code block includes invalid synchronization header information (for example, 00), the source code block is an invalid source code block. As shown in (Invalid header+data block) in FIG. 9A and FIG. 9B, the first frame of source code block is an invalid source code block, the second frame of source code block is a data block, the first frame of source code block O0 is divided into O00 and O01, the second frame of source code block D1 is divided into D10 and D11, and the first sub-code block O00 in the first frame of source code block O0 and the first sub-code block D10 in the second frame of source code block D1 are combined to generate a previous part (O00 and D10) of a to-be-encoded code block. Because the received two frames of data include the invalid source code block, 1-bit synchronization header information (for example, 0) may be added before the previous part of the to-be-encoded code block, and a 2-bit hot code (for example, 11) is added after the synchronization header information, to indicate that the received two frames of source code blocks include the invalid source code block. Correspondingly, two bits may be deleted from the first byte of the first source code block in the previous part of the to-be-encoded code block. The two deleted bits may be two most significant bits in the first byte of the first source code block, or may be two least significant bits in the first byte of the first source code block. In addition, the first sub-code block O01 in the first frame of source code block O0 and the first sub-code block D11 in the second frame of source code block D1 are combined to generate a subsequent part (O01 and D11) of the to-be-encoded code block. Finally, the 257-bit to-be-encoded code block is generated.

It should be noted that encoding overheads are reduced from 1.5625% to 0.4% by performing 256B/257B transcoding on the source code block output by the 128B/130B encoder, so that larger encoding overhead space is provided for FEC encoding. In addition, the 256B/257B transcoding scheme is also applicable to an Ethernet standard. In addition, in a frame format existing after transcoding in this embodiment, a transcode operation is performed for only the first sub-code block of a source code block (130-bit code block). In an application scenario in which there are two or more links, two 130-bit source code blocks are obtained from two different 128B/130B encoders. In a data transmission process, the first sub-code blocks (64 bits) of the two 130-bit source code blocks are first transmitted. Therefore, the frame format existing after transcoding helps complete a transcode operation in the first clock cycle, so that a latency caused by transcoding is effectively reduced.

Figure 10:
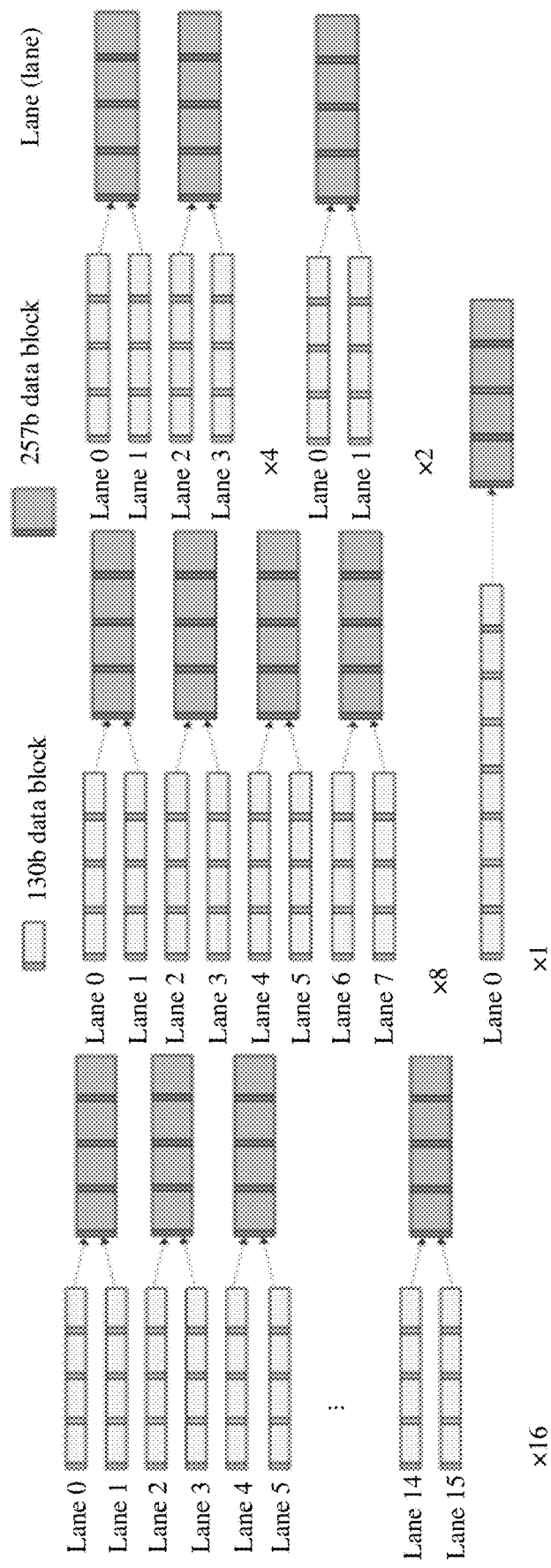
FIG. 10 is a schematic diagram of a mapping relationship between a 130-bit source code block and a 258-bit to-be-encoded code block according to an embodiment of this application.

For example, FIG. 10 is a schematic diagram of a mapping relationship between a 130-bit source code block and a 258-bit to-be-encoded code block according to an embodiment of this application. In a system including a plurality of 128B/130B encoders, two frames of 130-bit source code blocks may be received from two different 128B/130B encoders, and a 256B/258B transcode operation is performed on the two frames of 130-bit source code blocks, to obtain a 258-bit to-be-encoded code block.

FIG. 11A and FIG. 11B are a schematic diagram of transcoding of two frames of 130-bit source code blocks according to an embodiment of this application. The source code blocks are received from two different 128B/130B encoders. It is assumed that a bit width of data transmission is 64 bits. 2-bit synchronization header data in the 130-bit source code block is deleted. A length of remaining valid information is 128 bits, and the remaining valid information is divided into two 64-bit sub-code blocks. As shown in (All data block) in FIG. 11A and FIG. 11B, the first frame of source code block D0 is divided into D00 and D01, the second frame of source code block D1 is divided into D10 and D11, and the first sub-code block D00 in the first frame of source code block D0 and the first sub-code block D10 in the second frame of source code block D1 are combined to generate a previous part (D00 and D10) of a to-be-encoded code block. Because the received two frames of data are all data blocks (Data Block), 2-bit synchronization header information (for example, 01) may be added before the previous part of the to-be-encoded code block. In addition, the first sub-code block D01 in the first frame of source code block D0 and the first sub-code block D11 in the second frame of source code block D1 are combined to generate a subsequent part (D01 and D11) of the to-be-encoded code block. Finally, the 258-bit to-be-encoded code block is generated. As shown in (Ordered set block+data block) in FIG. 11A and FIG. 11B, the first frame of source code block is an ordered set block, the second frame of source code block is a data block, the first frame of source code block O0 is divided into O00 and O01, the second frame of source code block D1 is divided into D10 and D11, and the first sub-code block O00 in the first frame of source code block O0 and the first sub-code block D10 in the second frame of source code block D1 are combined to generate a previous part (O00 and D10) of a to-be-encoded code block. Because the received two frames of data include the ordered set block and the data block, 2-bit synchronization header information (for example, 10) may be added before the previous part of the to-be-encoded code block, and a 2-bit hot code (for example, 01) is added after the synchronization header information, to indicate data types of the received two frames of data. Herein, 0 represents the ordered set block, and 1 represents the data block. Correspondingly, two bits may be deleted from the first byte of the first ordered set block in the previous part of the to-be-encoded code block. The first byte is used to indicate a type of the ordered set block, and the two deleted bits may be two most significant bits in the first byte of the first ordered set block, or may be two least significant bits in the first byte of the first ordered set block. In addition, the first sub-code block O01 in the first frame of source code block O0 and the first sub-code block D11 in the second frame of source code block D1 are combined to generate a subsequent part (O01 and D11) of the to-be-encoded code block. Finally, the 258-bit to-be-encoded code block is generated. Another combination including the ordered set block type is similar, and details are not described herein. If a source code block includes invalid synchronization header information (for example, 00), the source code block is an invalid source code block. As shown in (Invalid header+data block) in FIG. 11A and FIG. 11B, the first frame of source code block is an invalid source code block, the second frame of source code block is a data block, the first frame of source code block O0 is divided into O00 and O01, the second frame of source code block D1 is divided into D10 and D11, and the first sub-code block O00 in the first frame of source code block O0 and the first sub-code block D10 in the second frame of source code block D1 are combined to generate a previous part (O00 and D10) of a to-be-encoded code block. Because the received two frames of data include the invalid source code block, 2-bit synchronization header information (for example, 10) may be added before the previous part of the to-be-encoded code block, and a 2-bit hot code (for example, 11) is added after the synchronization header information, to indicate that the received two frames of source code blocks include the invalid source code block. Correspondingly, two bits may be deleted from the first byte of the first source code block in the previous part of the to-be-encoded code block. The two deleted bits may be two most significant bits in the first byte of the first source code block, or may be two least significant bits in the first byte of the first source code block. In addition, the first sub-code block O01 in the first frame of source code block O0 and the first sub-code block D11 in the second frame of source code block D1 are combined to generate a subsequent part (O01 and D11) of the to-be-encoded code block. Finally, the 258-bit to-be-encoded code block is generated.

It should be noted that encoding overheads are reduced from 1.5625% to 0.8% by performing 256B/258B transcoding on the source code block output by the 128B/130B encoder, so that larger encoding overhead space is provided for FEC encoding. In addition, in a frame format existing after transcoding in this embodiment, a transcode operation is performed for only the first sub-code block of a source code block (130-bit code block). In an application scenario in which there are two or more links, two 130-bit source code blocks are obtained from two different 128B/130B encoders. In a data transmission process, the first sub-code blocks (64 bits) of the two 130-bit source code blocks are first transmitted. Therefore, the frame format existing after transcoding helps complete a transcode operation in the first clock cycle, so that a latency caused by transcoding is effectively reduced.

In a third optional scheme, synchronization header data of each of the plurality of source code blocks may be first deleted to obtain remaining valid information, then the remaining valid information in the plurality of source code blocks is combined to generate a long code block, and bit data is added before the long code block to obtain the to-be-encoded code block. The bit data may include synchronization header information or a hot code. When the plurality of source code blocks are all data blocks, synchronization header information with at least one bit is added before the long code block. The synchronization header information is used to indicate that the plurality of source code blocks are all data blocks. When the plurality of source code blocks include an ordered set block, synchronization header information with at least one bit is added before the long code block, and a hot code with a plurality of bits is added after the synchronization header information. The synchronization header information is used to indicate that the plurality of source code blocks include the ordered set block, and the hot code is used to indicate a data type of each source code block. Finally, a plurality of bits are deleted from the first byte of the first ordered set block in the long code block.

Figure 12:
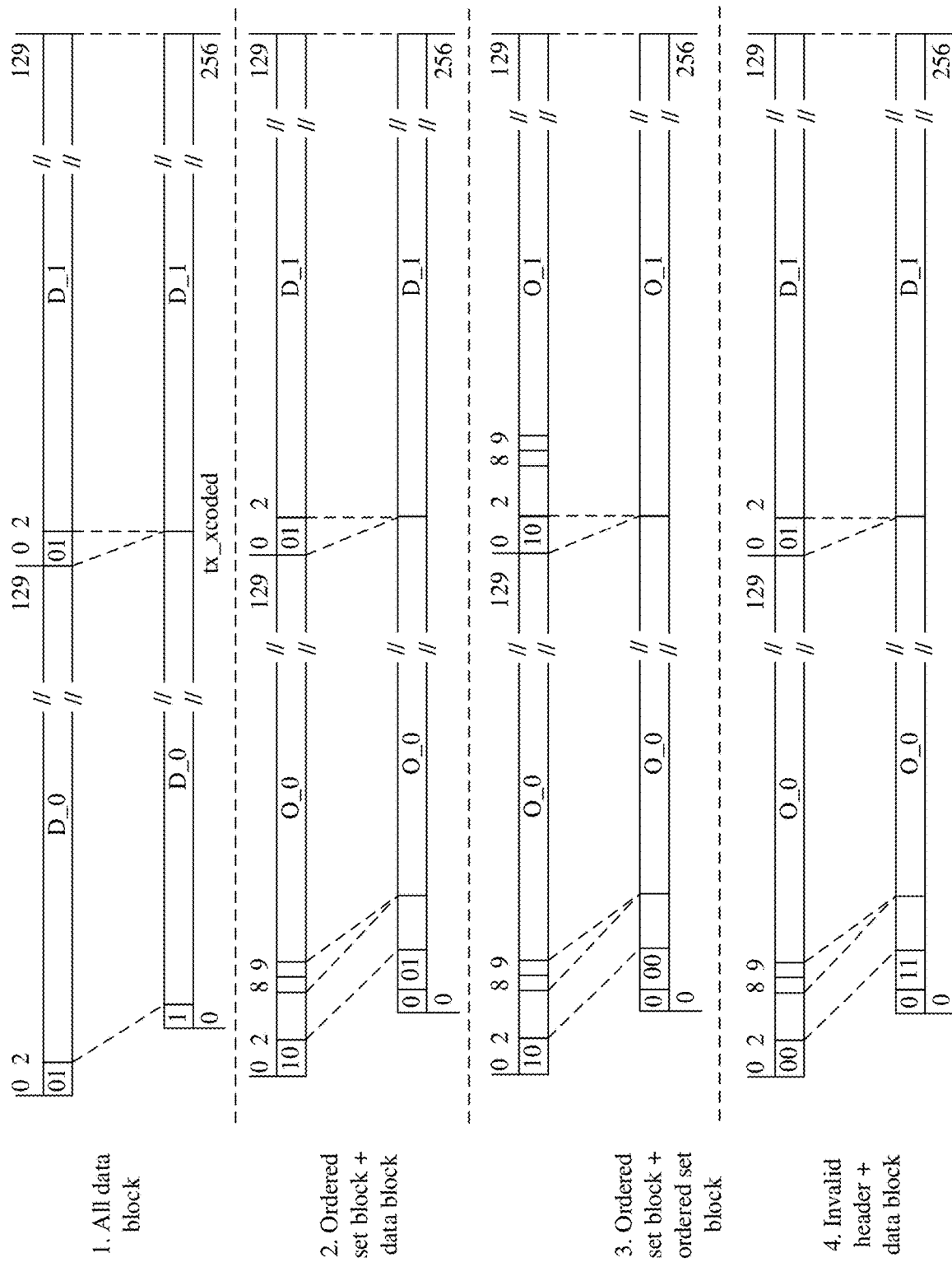
FIG. 12 is a schematic diagram of still another type of transcoding of two frames of 130-bit source code blocks according to an embodiment of this application.

FIG. 12 is a schematic diagram of another type of transcoding of two frames of 130-bit source code blocks according to an embodiment of this application. The two frames of 130-bit source code blocks are first received from two different 128B/130B encoders, and synchronization header data in each frame of 130-bit source code block is deleted. Each frame includes 2-bit synchronization header data. After the deletion, two frames of 128-bit remaining valid information are obtained. Then, the 128-bit remaining valid information forms a 256-bit long code block. As shown in (All data block) in FIG. 12, synchronization header data 01 in a source code block D_0 and synchronization header data 01 in a source code block D_1 are deleted, and remaining valid information in the source code block D_0 and remaining valid information in the source code block D_1 are combined to generate a long code block. In addition, 1-bit synchronization header information (for example, 1) is added before the long code block, to indicate that the two frames of source code blocks are all data blocks. Finally, a 257-bit to-be-encoded code block is generated. As shown in (Ordered set block+data block) in FIG. 12, synchronization header data 10 in a source code block O_0 and synchronization header data 01 in a source code block D_1 are deleted, and remaining valid information in the source code block O_0 and remaining valid information in the source code block D_1 are combined to generate a long code block. In addition, 1-bit synchronization header information (for example, 0) is added before the long code block, to indicate that the two frames of source code blocks include an ordered set block. Moreover, a 2-bit hot code (for example, 01) is added after the synchronization header information, to indicate data types of the received two frames of data. Herein, 0 represents the ordered set block, and 1 represents a data block. In addition, two bits are deleted from the first byte of the first ordered set block in the long code block. The first byte is used to indicate a type of the ordered set block, and the two deleted bits may be two most significant bits in the first byte of the first ordered set block, or may be two least significant bits in the first byte of the first ordered set block. Finally, a 257-bit to-be-encoded code block is generated. Another combination including the ordered set block type is similar, and details are not described herein. If a source code block includes invalid synchronization header information (for example, 00), the source code block is an invalid source code block. As shown in (Invalid header+data block) in FIG. 12, the first frame of source code block is an invalid source code block, the second frame of source code block is a data block, invalid synchronization header data 00 in the source code block O_0 and synchronization header data 01 in the source code block D_1 are deleted, and remaining valid information in the source code block O_0 and remaining valid information in the source code block D_1 are combined to generate a long code block. Because the received two frames of source code blocks include the invalid source code block, 1-bit synchronization header information (for example, 0) may be added before the long code block, and a 2-bit hot code (for example, 11) is added after the synchronization header information, to indicate that the received two frames of data include the invalid source code block. In addition, two bits are deleted from the first byte of the first source code block in the long code block. The two deleted bits may be two most significant bits in the first byte of the first source code block, or may be two least significant bits in the first byte of the first source code block. Finally, a 257-bit to-be-encoded code block is generated.

Figure 13:
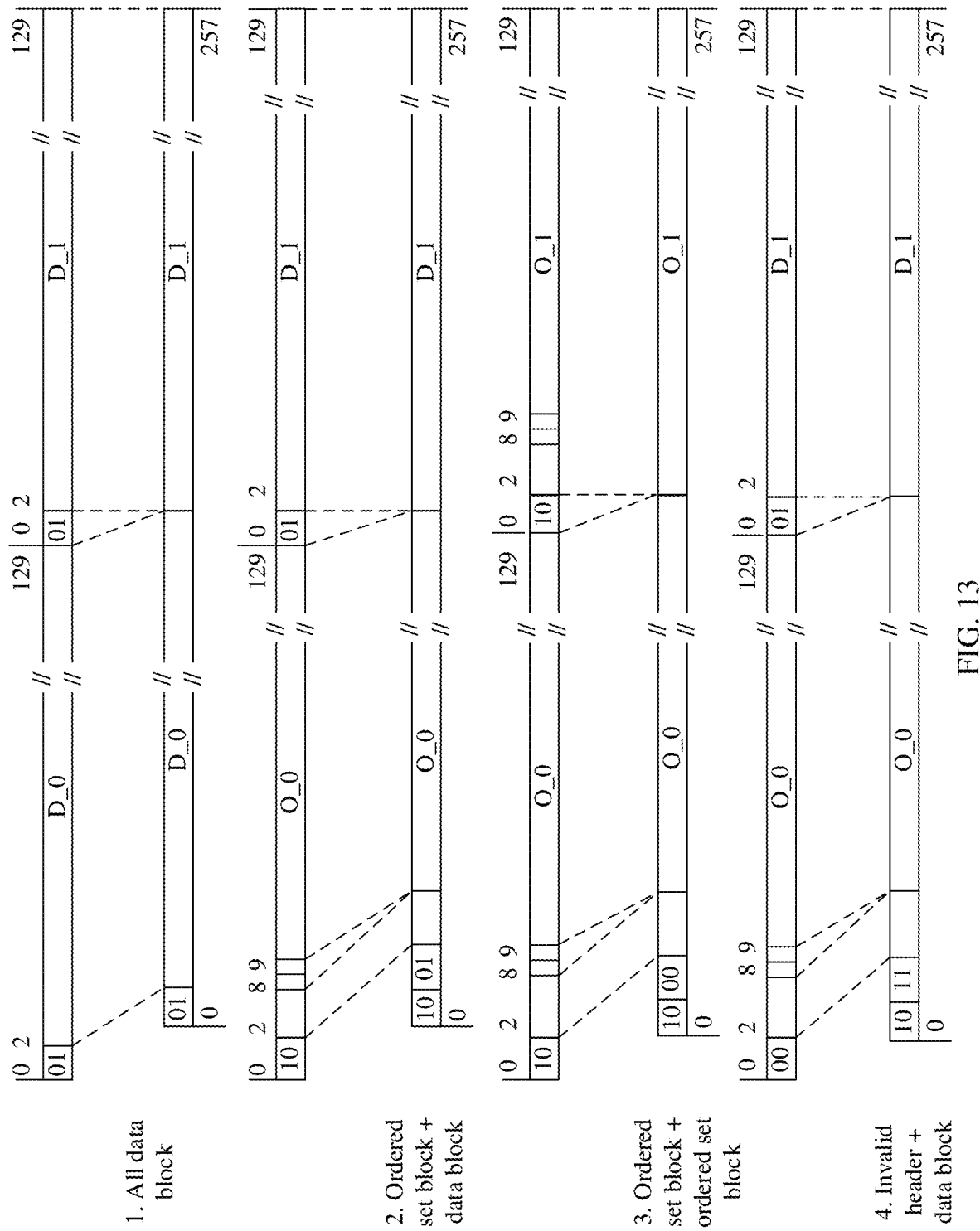
FIG. 13 is a schematic diagram of still another type of transcoding of two frames of 130-bit source code blocks according to an embodiment of this application.

FIG. 13 is a schematic diagram of still another type of transcoding of two frames of 130-bit source code blocks according to an embodiment of this application. The two frames of 130-bit source code blocks are first received from two different 128B/130B encoders, and synchronization header data in each frame of 130-bit source code block is deleted. Each frame includes 2-bit synchronization header data. After the deletion, two frames of 128-bit remaining valid information are obtained. Then, the 128-bit remaining valid information forms a 256-bit long code block. As shown in (All data block) in FIG. 13, synchronization header data 01 in a source code block D_0 and synchronization header data 01 in a source code block D_1 are deleted, and remaining valid information in the source code block D_0 and remaining valid information in the source code block D_1 are combined to generate a long code block. In addition, 2-bit synchronization header information (for example, 01) is added before the long code block, to indicate that the two frames of source code blocks are all data blocks. Finally, a 258-bit to-be-encoded code block is generated. As shown in (Ordered set block+data block) in FIG. 13, synchronization header data 10 in a source code block O_0 and synchronization header data 01 in a source code block D_1 are deleted, and remaining valid information in the source code block O_0 and remaining valid information in the source code block D_1 are combined to generate a long code block. In addition, 2-bit synchronization header information (for example, 10) is added before the long code block, to indicate that the two frames of source code blocks include an ordered set block. Moreover, a 2-bit hot code (for example, 01) is added after the synchronization header information, to indicate data types of the received two frames of data. Herein, 0 represents the ordered set block, and 1 represents a data block. In addition, two bits are deleted from the first byte of the first ordered set block in the long code block. The first byte is used to indicate a type of the ordered set block, and the two deleted bits may be two most significant bits in the first byte of the first ordered set block, or may be two least significant bits in the first byte of the first ordered set block. Finally, a 258-bit to-be-encoded code block is generated. Another combination including the ordered set block type is similar, and details are not described herein. If a source code block includes invalid synchronization header information (for example, 00), the source code block is an invalid source code block. As shown in (Invalid header+data block) in FIG. 13, the first frame of source code block is an invalid source code block, the second frame of source code block is a data block, invalid synchronization header data 00 in a source code block O_0 and synchronization header data 01 in a source code block D_1 are deleted, and remaining valid information in the source code block O_0 and remaining valid information in the source code block D_1 are combined to generate a long code block. Because the received two frames of source code blocks include the invalid source code block, 2-bit synchronization header information (for example, 10) may be added before the long code block, and a 2-bit hot code (for example, 11) is added after the synchronization header information, to indicate that the received two frames of data include the invalid source code block. In addition, two bits are deleted from the first byte of the first source code block in the long code block. The two deleted bits may be two most significant bits in the first byte of the first source code block, or may be two least significant bits in the first byte of the first source code block. Finally, a 258-bit to-be-encoded code block is generated.

It should be noted that, compared with that in the transcoding scheme in the foregoing embodiment, in a frame format in transcoding in this embodiment of this application, a source code block does not need to be sliced, but a transcode operation is directly performed on an entire 130-bit source code block. This can provide a frame format reference for the transcode operation.

It should be noted that the foregoing transcoding method in this embodiment of this application may be implemented as an independent method. For example, transcoding is performed based on a 256B/258B transcoding scheme to obtain a 258-bit code block, or transcoding is performed based on a 128B/132B transcoding scheme to obtain a 132-bit code block.

S603: Scramble the to-be-encoded code block.

S604: Encode the to-be-encoded code block to obtain a forward error correction FEC code.

In specific implementation, the source code block may be first transcoded to obtain the to-be-encoded code block, then an FEC codeword is designed according to a prime factorization method, and the to-be-encoded code block is encoded to obtain the FEC code. For the prime factorization method, refer to the steps in FIG. 5 in the foregoing embodiment. Details are not described again in this step.

It should be noted that, after the source code block is obtained through encoding based on the 128B/130B encoding scheme, different to-be-encoded code blocks may be obtained based on a transcoding scheme or a non-transcoding scheme. A preferred transcoding scheme in this embodiment of this application includes a 256B/258B transcoding scheme or a 128B/132B transcoding scheme. After different to-be-encoded code blocks are encoded, different codewords may be obtained. A preferred codeword in this embodiment of this application is as follows: When the source code block is transcoded based on the 256B/258B transcoding scheme to obtain the to-be-encoded code block, a codeword of the FEC code obtained through encoding includes: N=192, K=172, T=10, and M=8; or N=184, K=172, T=6, and M=8; or N=96, K=86, T=5, and M=8. When the source code block is transcoded based on the 128B/132B transcoding scheme, a codeword of the FEC code obtained through encoding includes: N=136, K=132, T=2, and M=8; or N=144, K=132, T=6, and M=8; or N=152, K=132, T=10, and M=8; or N=72, K=66, T=3, and M=8. When the to-be-encoded code block is a 130-bit code block, a codeword of the FEC code obtained through encoding includes: N=136, K=130, T=3, and M=8; or N=144, K=130, T=7, and M=8; or N=152, K=130, T=11, and M=8. It may be understood that the foregoing codeword is an example, and another codeword may be obtained through encoding. This is not limited herein.

In addition, in an application scenario with a long distance, a high loss, and a low latency requirement, a long code such as RS (272, 258, T=7) or RS (544, 514, T=15) may be preferentially selected. In an application scenario with a short distance, a low loss, and a high latency requirement, a short code such as RS (144, 132, T=6), RS (144, 130, T=7), RS (192, 172, T=10), or RS (72, 66, T=3) may be preferentially selected.

S605: Distribute the FEC code to a plurality of physical layer lanes for sending.

In specific implementation, the FEC code may be sequentially distributed to the plurality of physical layer lanes in a form of symbols, and one symbol is distributed to each lane each time. After one symbol is distributed to each of all the physical layer lanes, a new round of distribution is started. For example, for x16 lanes, a symbol 0 is distributed to a lane 0, a symbol 1 is distributed to a lane 1, a symbol 2 is distributed to a lane 2, and by analogy, a symbol 15 is distributed to a lane 15. In this case, distribution is performed on all the physical layer lanes once, and then a new round of FEC code distribution is started. To be specific, a symbol 16 is distributed to the lane 0, a symbol 17 is distributed to the lane 1, and so on. A total quantity of symbols in the FEC code that are distributed to each physical layer lane is a ratio of a total quantity of symbols of a codeword of the FEC code to a quantity of the plurality of physical layer lanes. This manner is applied to an application scenario in which a single FEC codeword output by one FEC encoder is distributed to different physical layer lanes, and a data distribution solution is provided for a multi-lane transmission scenario.

For example, FIG. 14 is a schematic diagram of FEC code distribution according to an embodiment of this application. For RS (144, 130, M=8) and x16 physical layer lanes, a total quantity of symbols in a codeword of the FEC code is 144. For the x16 physical layer lanes, one symbol (M=8 bits) is sent each time on each physical layer lane, and 16 symbols are sent each time on the 16 lanes. Herein, distribution and mapping of the FEC code on the plurality of physical layer lanes are described in a form of a two-dimensional array. The two-dimensional array does not exist in an actual system. The FEC code is mapped to the two-dimensional array in a form of 16 symbols per row, to generate a 9×16 two-dimensional array. A quantity of rows of the two-dimensional array is a ratio of the total quantity of symbols in the codeword of the FEC code to a quantity of the plurality of physical layer lanes, that is, 144/16=9. Then, the FEC code in the two-dimensional array is distributed to the 16 physical layer lanes by columns. The two-dimensional array has 16 columns in total, and each column corresponds to one physical layer lane. In this way, the FEC code is mapped to the physical layer lanes. For x8 physical layer lanes, the FEC code may be mapped to an 18×8 two-dimensional array, and each row includes eight symbols. Then, the FEC code in the two-dimensional array is mapped to the eight physical layer lanes. A mapping relationship for x4 lanes, x2 lanes, or x1 lane can be deduced according to the same rule.

For example, FIG. 15 is a schematic diagram of another type of FEC code distribution according to an embodiment of this application. For RS (192, 172, M=8) and x16 physical layer lanes, the FEC code has 192 symbols in total. The FEC code may be mapped to the 16 physical layer lanes for sending, and 192/16=12. Therefore, the FEC code can be mapped to the 16 physical layer lanes without designing a gearbox. For x8 physical layer lanes, x4 physical layer lanes, x2 physical layer lanes, or x1 physical layer lane, a mapping rule can be deduced by analogy.

Figure 16:
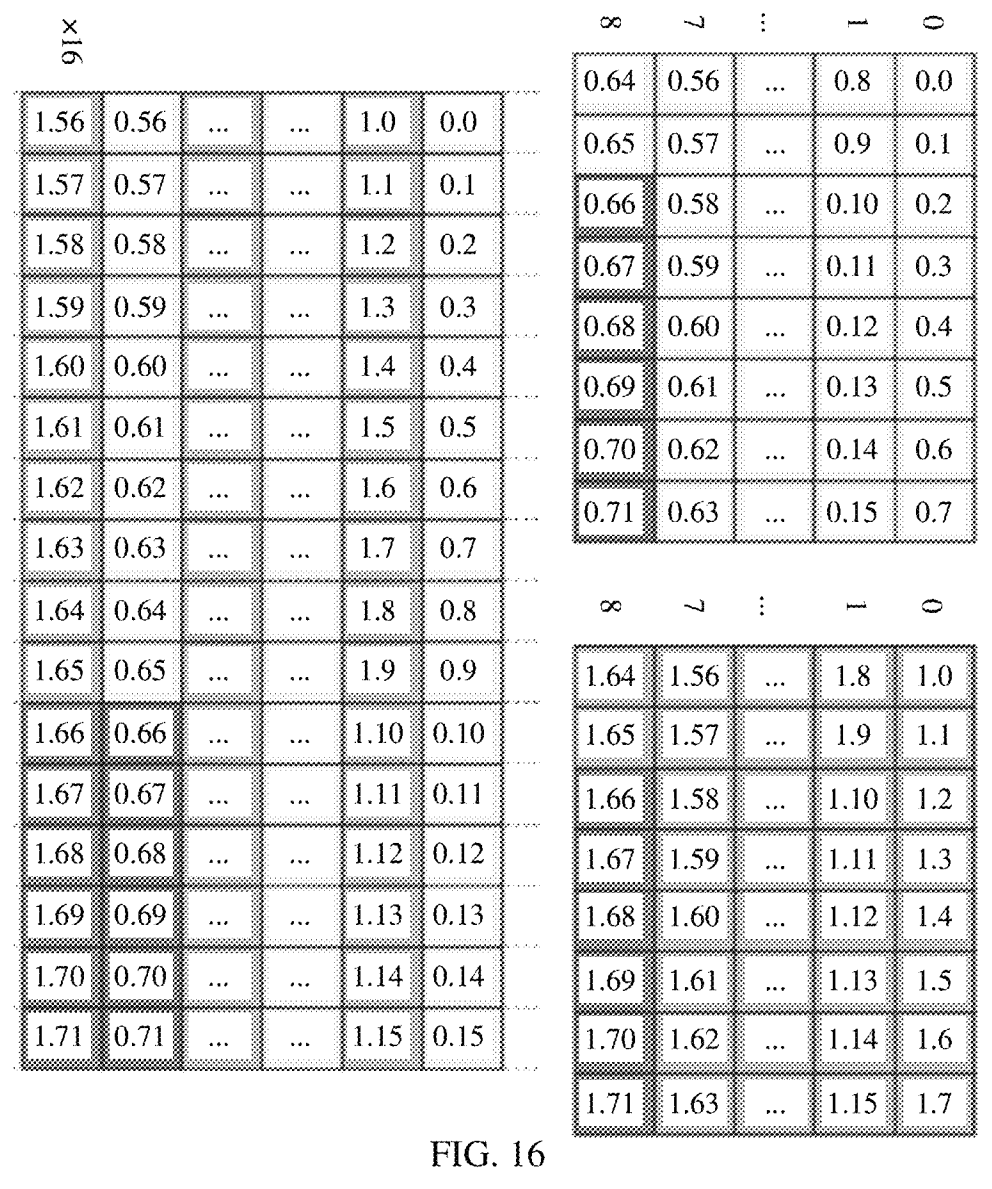

FIG. 16 is a schematic diagram of still another type of FEC code distribution according to an embodiment of this application. For RS (192, 172, M=8), a valid information length of the FEC code is 172×8=1376 bits. A 256B/258B transcoding scheme is used as an example. During FEC encoding, valid information bits need to be collected from a 258-bit source code block. Because $1376/258 = 5⅓$, 5⅓ 258-bit source code blocks need to be collected to form a quantity of information bits required for RS (192, 172, M=8) encoding. To be specific, $5⅓ \times 3 = \ne 258$-bit source code blocks are collected and are encoded into three RS (192, 172, M=8) FEC codewords. In this way, the FEC codewords are aligned with the source code blocks. FIG. 16 shows only a mapping relationship between a first FEC codeword in the three RS (192, 172, M=8) codewords and a physical layer lane. For x8 physical layer lanes, x4 physical layer lanes, x2 physical layer lanes, or x1 physical layer lane, a mapping rule can be deduced by analogy.

Optionally, a plurality of FEC codes may be interleaved and mapped to a gearbox in a form of symbols. A quantity of columns of the gearbox is a quantity of the plurality of physical layer lanes. Then, FEC codes in the gearbox are sequentially distributed to different physical layer lanes. This manner is applied to an application scenario in which a plurality of FEC codes output by a plurality of FEC encoders are distributed to different physical layer lanes, and a data distribution solution is provided for a multi-lane transmission scenario.

In this embodiment of this application, a mapping relationship between the plurality of FEC codes and the plurality of physical layer lanes is described in a form of a two-dimensional array. The two-dimensional array does not exist in an actual system. An FEC code may be mapped to one two-dimensional array. A quantity of columns of the two-dimensional array is a ratio of a quantity of the plurality of physical layer lanes to a quantity of the plurality of FEC codes, and a quantity of rows of the two-dimensional array is a ratio of a total quantity of symbols in a codeword of one FEC code to the quantity of columns of the two-dimensional array. Then, FEC codes in a plurality of two-dimensional arrays are interleaved and mapped to a gearbox. A quantity of columns of the gearbox is the quantity of the plurality of physical layer lanes, and a quantity of rows of the gearbox is the quantity of rows of the two-dimensional array. Finally, the FEC codes in the gearbox are mapped to the plurality of physical layer lanes by columns for sending.

For example, FIG. 16 is a schematic diagram of still another type of FEC code distribution according to an embodiment of this application. For RS (72, 66, M=8) and x16 physical layer lanes, a to-be-encoded code block is first distributed to two FEC encoders, and FEC codes obtained through encoding by the two FEC encoders are interleaved and distributed downward to the 16 physical layer lanes. A total length of the FEC code is 72 symbols, and each FEC symbol includes M bits (M=8 herein). For the x16 physical layer lanes, one symbol is sent each time on each physical layer lane, and 16 symbols are sent each time on the 16 physical layer lanes. Because 72/16=4.5, which is not an integer, a single FEC code cannot be completely mapped to the 16 physical layer lanes. In this scenario, a gearbox (Gearbox) needs to be designed based on a ratio of the total length of the FEC code to a quantity of physical layer lanes. In this embodiment of this application, 72/16=4.5, and a decimal part is 0.5 (1/0.5=2). To implement matching between the FEC code and the transmission lanes, a 1:2 gearbox needs to be designed to correspond to the two FEC encoders. Data in the two FEC encoders is first mapped to two two-dimensional arrays in a manner of eight symbols per row (a quantity of symbols in each row is a quotient of dividing the quantity of lanes by the quantity of FEC encoders) and nine rows in total. Then, FEC codes in the two two-dimensional arrays are interleaved and mapped to the gearbox. After the mapping, a size of an array in the gearbox is nine rows and 16 columns. For example, FEC symbols in the $0^{th}$ row (rows are numbered from 0) and the $1^{st}$ row in RS (72, 66, M=8) Codec0 are mapped to the $0^{th}$ row in the gearbox, and FEC symbols in the $0^{th}$ row and the $1^{st}$ row in RS (72, 66, M=8) Codec1 are mapped to the $1^{st}$ row in the gearbox. Finally, FEC codes in the gearbox are distributed to the 16 physical layer lanes by columns.

Figure 17:
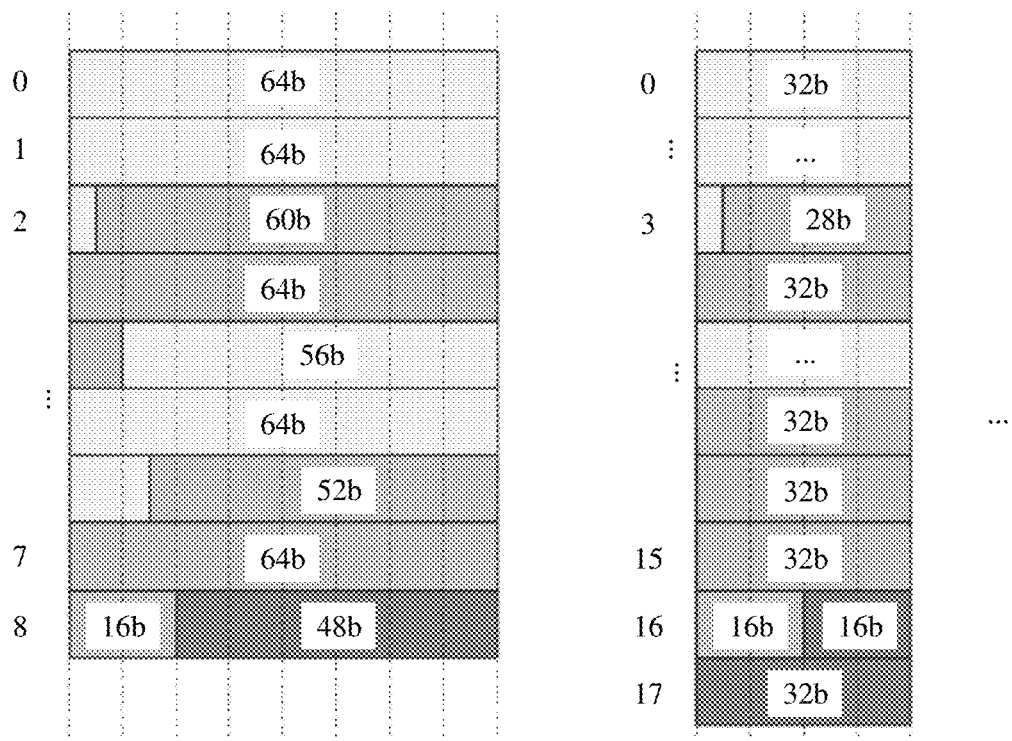
FIG. 17 is a schematic diagram of still another type of FEC code distribution according to an embodiment of this application.

FIG. 17 is a schematic diagram of still another type of FEC code distribution according to an embodiment of this application. For RS (72, 66, M=8) and x8 physical layer lanes, because 72/8=9, which is an integer, a single FEC code can be completely mapped to the eight physical layer lanes, and there is no need to design a gearbox. For x4 physical layer lanes, x2 physical layer lanes, or x1 physical layer lane, the same rule may be used for analogy.

Optionally, after the FEC code is obtained by encoding the to-be-encoded code block, a plurality of dummy bits may be added to the FEC code. A quantity of symbols in the FEC code may match a quantity of physical layer lanes by adding the dummy bits. In this way, a design of a gearbox can be simplified in a process of distributing the FEC code to the plurality of physical layer lanes, and an optimization effect can be achieved.

For example, for RS (271, 257, M=10) and x4 physical layer lanes, the FEC code cannot be directly mapped to the four physical layer lanes in a form of symbols. One symbol (1×10=10 bits) may be added based on 271 FEC symbols, and a total length N of an FEC code obtained after the addition is 272 FEC symbols. Therefore, the 272 FEC symbols are obtained by adding dummy bits based on RS (271, 257, M=10). Because 272/4=68, the FEC code can be directly mapped to the x4 lanes.

The foregoing describes in detail the methods in the embodiments of this application. The following provides apparatuses in the embodiments of this application.

Figure 18:
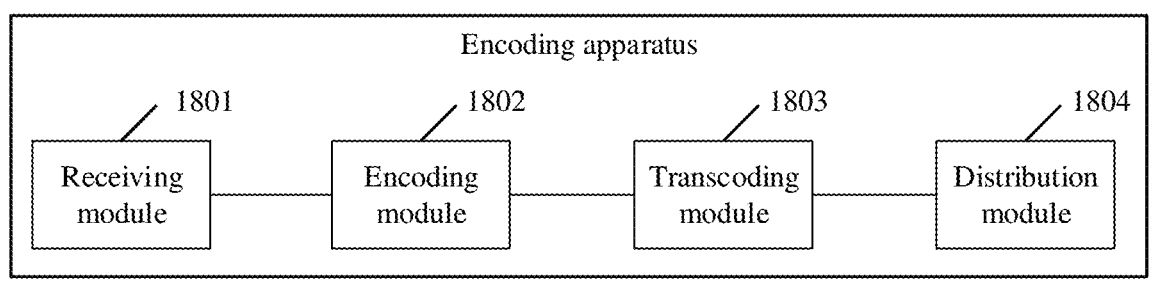
FIG. 18 is a schematic structural diagram of an encoding apparatus according to an embodiment of this application.

FIG. 18 is a schematic structural diagram of an encoding apparatus according to an embodiment of this application. The encoding apparatus may include a receiving module 1801, an encoding module 1802, a transcoding module 1803, and a distribution module 1804. Detailed descriptions of the modules are as follows:

The receiving module 1801 is configured to receive a to-be-encoded code block whose length is L, where L is a positive integer.

The encoding module 1802 is configured to encode the to-be-encoded code block to obtain a forward error correction FEC code, where a valid information length K of the FEC code is an integer multiple of a largest prime factor of L, and a total length N of the FEC code is a sum of K and a product of 2 and an error correction capability T of the FEC code.

A quantity of bits included in each symbol in the FEC code is M, and M is a smallest even number satisfying $(2^M-1) \geq N$.

Optionally, the transcoding module 1803 is further configured to transcode a source code block to obtain the to-be-encoded code block.

Optionally, the transcoding module 1803 is further configured to add synchronization header information with at least one bit to a single source code block to obtain the to-be-encoded code block, and the synchronization header information is used to indicate a data type of the source code block.

Optionally, the transcoding module 1803 is further configured to: delete synchronization header data of each of a plurality of source code blocks to obtain remaining valid information; and combine the remaining valid information in the plurality of source code blocks to generate the to-be-encoded code block.

Optionally, the transcoding module 1803 is further configured to: divide the remaining valid information of each source code block into two sub-code blocks; combine the first sub-code blocks in the pairs of sub-code blocks of the plurality of source code blocks to generate a previous part of the to-be-encoded code block, and add bit data before the previous part of the to-be-encoded code block; and combine the second sub-code blocks in the pairs of sub-code blocks of the plurality of source code blocks to generate a subsequent part of the to-be-encoded code block.

Optionally, the transcoding module 1803 is further configured to: when the plurality of source code blocks are all data blocks, add synchronization header information with at least one bit before the previous part of the to-be-encoded code block, where the synchronization header information is used to indicate that the plurality of source code blocks are all data blocks.

Optionally, the transcoding module 1803 is further configured to: when the plurality of source code blocks include an ordered set block, add synchronization header information with at least one bit before the previous part of the to-be-encoded code block, and add a hot code with a plurality of bits after the synchronization header information, where the synchronization header information is used to indicate that the plurality of source code blocks include the ordered set block, and the hot code is used to indicate a data type of each source code block; and delete a plurality of bits in the first byte of the first ordered set block in the previous part of the to-be-encoded code block.

Optionally, the transcoding module 1803 is further configured to: delete synchronization header data of each of a plurality of source code blocks to obtain remaining valid information; combine the remaining valid information in the plurality of source code blocks to generate a long code block; and add bit data before the long code block to generate the to-be-encoded code block.

Optionally, the transcoding module 1803 is further configured to: when the plurality of source code blocks are all data blocks, add synchronization header information with at least one bit before the long code block, where the synchronization header information is used to indicate that the plurality of source code blocks are all data blocks.

Optionally, the transcoding module 1803 is further configured to: when the plurality of source code blocks include an ordered set block, add synchronization header information with at least one bit before the long code block, and add a hot code with a plurality of bits after the synchronization header information, where the synchronization header information is used to indicate that the plurality of source code blocks include the ordered set block, and the hot code is used to indicate a data type of each source code block; and delete a plurality of bits in the first byte of the first ordered set block in the long code block.

Optionally, the encoding module 1802 is further configured to perform encoding based on a 128B/130B encoding scheme to obtain the source code block.

Optionally, the transcoding module 1804 is further configured to transcode the source code block based on a 256B/258B transcoding scheme or a 128B/132B transcoding scheme, to obtain the to-be-encoded code block.

When L=258, N=192, K=172, T=10, and M=8; or N=184, K=172, T=6, and M=8; or N=96, K=86, T=5, and M=8.

When L=132, N=136, K=132, T=2, and M=8; or N=144, K=132, T=6, and M=8; or N=152, K=132, T=10, and M=8; or N=72, K=66, T=3, and M=8.

When L=130, N=136, K=130, T=3, and M=8; or N=144, K=130, T=7, and M=8; or N=152, K=130, T=11, and M=8.

Optionally, the distribution module 1804 is further configured to distribute the FEC code to a plurality of physical layer lanes for sending.

It should be noted that, for implementation of the modules, refer to corresponding descriptions in the method embodiments shown in FIG. 5 and FIG. 6. The modules perform the methods and functions performed by the encoder, the transcoder, and the FEC encoder in the foregoing embodiments.

Figure 19:
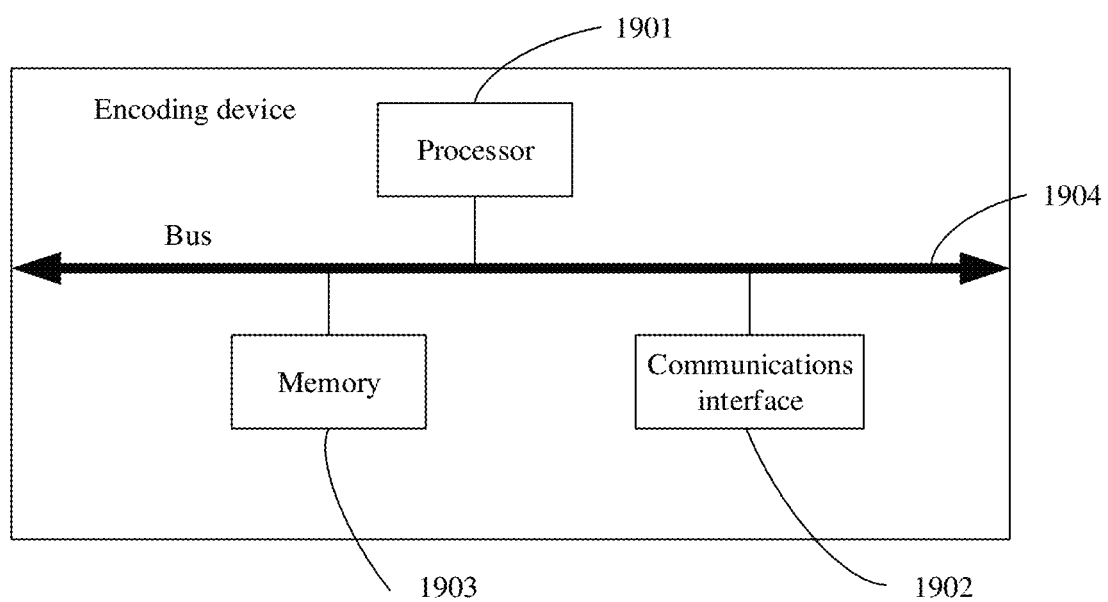
FIG. 19 is a schematic structural diagram of an encoding device according to an embodiment of this application.

FIG. 19 is a schematic structural diagram of an encoding device according to this application. As shown in FIG. 19, the encoding device may include at least one processor 1901, at least one communications interface 1902, at least one memory 1903, and at least one communications bus 1904.

The processor 1901 may be a central processing unit, a general-purpose processor, a digital signal processor, an application-specific integrated circuit, a field programmable gate array or another programmable logic device, a transistor logic device, a hardware component, or any combination thereof. The processor 1901 may implement or execute various example logical blocks, modules, and circuits described with reference to content disclosed in this application. Alternatively, the processor may be a combination of processors implementing a computing function, for example, a combination of one or more microprocessors, or a combination of a digital signal processor and a microprocessor. The communications bus 1904 may be a peripheral component interconnect PCI bus, an extended industry standard architecture EISA bus, or the like. The bus may be classified into an address bus, a data bus, a control bus, or the like. For ease of representation, only one thick line is used to represent the bus in FIG. 19, but this does not mean that there is only one bus or only one type of bus. The communications bus 1904 is configured to implement connection and communication between the components. The communications interface 1902 in the device in this embodiment of this application is configured to perform signaling or data communication with another node device. The memory 1903 may include a volatile memory, for example, a nonvolatile dynamic random access memory (NVRAM), a phase change random access memory (PRAM), or a magnetoresistive random access memory (MRAM). The memory 1903 may further include a nonvolatile memory, for example, at least one magnetic disk storage component, an electrically erasable programmable read-only memory (EEPROM), a flash memory device such as a NOR flash memory or a NAND flash memory, or a semiconductor component such as a solid-state drive (SSD). Optionally, the memory 1903 may alternatively be at least one storage apparatus far away from the processor 1901. Optionally, the memory 1903 may further store a group of program code, and optionally, the processor 1901 may further execute a program stored in the memory 1903.

A to-be-encoded code block whose length is L is received, where L is a positive integer.

The to-be-encoded code block is encoded to obtain a forward error correction FEC code, where a valid information length K of the FEC code is an integer multiple of a largest prime factor of L, and a total length N of the FEC code is a sum of K and a product of 2 and an error correction capability T of the FEC code.

A quantity of bits included in each symbol in the FEC code is M, and M is a smallest even number satisfying $(2^M-1) \geq N$.

Optionally, the processor 1901 is further configured to perform the following operation: transcoding a source code block to obtain the to-be-encoded code block.

Optionally, the processor 1901 is further configured to perform the following operation: adding synchronization header information with at least one bit to a single source code block to obtain the to-be-encoded code block, where the synchronization header information is used to indicate a data type of the source code block.

Optionally, the processor 1901 is further configured to perform the following operations: deleting synchronization header data of each of a plurality of source code blocks to obtain remaining valid information; and combining the remaining valid information in the plurality of source code blocks to generate the to-be-encoded code block.

Optionally, the processor 1901 is further configured to perform the following operations: dividing the remaining valid information of each source code block into two sub-code blocks; combining the first sub-code blocks in the pairs of sub-code blocks of the plurality of source code blocks to generate a previous part of the to-be-encoded code block, and adding bit data in front of the previous part of the to-be-encoded code block; and combining the second sub-code blocks in the pairs of sub-code blocks of the plurality of source code blocks to generate a subsequent part of the to-be-encoded code block.

Optionally, the processor 1901 is further configured to perform the following operation: when the plurality of source code blocks are all data blocks, adding synchronization header information with at least one bit before the previous part of the to-be-encoded code block, where the synchronization header information is used to indicate that the plurality of source code blocks are all data blocks.

Optionally, the processor 1901 is further configured to perform the following operations: when the plurality of source code blocks include an ordered set block, adding synchronization header information with at least one bit before the previous part of the to-be-encoded code block, and adding a hot code with a plurality of bits after the synchronization header information, where the synchronization header information is used to indicate that the plurality of source code blocks include the ordered set block, and the hot code is used to indicate a data type of each source code block; and deleting a plurality of bits in the first byte of the first ordered set block in the previous part of the to-be-encoded code block.

Optionally, the processor 1901 is further configured to perform the following operations: deleting synchronization header data of each of a plurality of source code blocks to obtain remaining valid information; combining the remaining valid information in the plurality of source code blocks to generate a long code block; and adding bit data before the long code block to generate the to-be-encoded code block.

Optionally, the processor 1901 is further configured to perform the following operation: when the plurality of source code blocks are all data blocks, adding synchronization header information with at least one bit before the long code block, where the synchronization header information is used to indicate that the plurality of source code blocks are all data blocks.

Optionally, the processor 1901 is further configured to perform the following operations: when the plurality of source code blocks include an ordered set block, adding synchronization header information with at least one bit before the long code block, and adding a hot code with a plurality of bits after the synchronization header information, where the synchronization header information is used to indicate that the plurality of source code blocks include the ordered set block, and the hot code is used to indicate a data type of each source code block; and deleting a plurality of bits in the first byte of the first ordered set block in the long code block.

Optionally, the processor 1901 is further configured to perform the following operation: performing encoding based on a 128B/130B encoding scheme to obtain the source code block.

Optionally, the processor 1901 is further configured to perform the following operation: transcoding the source code block based on a 256B/258B transcoding scheme or a 128B/132B transcoding scheme, to obtain the to-be-encoded code block.

When $L=258$, $N=192$, $K=172$, $T=10$, and $M=8$; or $N=184$, $K=172$, $T=6$, and $M=8$; or $N=96$, $K=86$, $T=5$, and $M=8$.

When $L=132$, $N=136$, $K=132$, $T=2$, and $M=8$; or $N=144$, $K=132$, $T=6$, and $M=8$; or $N=152$, $K=132$, $T=10$, and $M=8$; or $N=72$, $K=66$, $T=3$, and $M=8$.

When $L=130$, $N=136$, $K=130$, $T=3$, and $M=8$; or $N=144$, $K=130$, $T=7$, and $M=8$; or $N=152$, $K=130$, $T=11$, and $M=8$.

Optionally, the processor 1901 is further configured to perform the following operation: distributing the FEC code to a plurality of physical layer lanes for sending.

Further, the processor may cooperate with the memory and the communications interface to perform operations of the encoder, the transcoder, and the FEC encoder in the foregoing embodiments of this application.

All or some of the foregoing embodiments may be implemented by using software, hardware, firmware, or any combination thereof. When software is used to implement the embodiments, the embodiments may be implemented all or partially in a form of a computer program product. The computer program product includes one or more computer instructions. When the computer program instructions are loaded and executed on a computer, the procedures or the functions according to the embodiments of this application are all or partially generated. The computer may be a general-purpose computer, a dedicated computer, a computer network, or another programmable apparatus. The computer instructions may be stored in a computer-readable storage medium or may be transmitted from one computer-readable storage medium to another computer-readable storage medium. For example, the computer instructions may be transmitted from one website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive Solid State Disk (SSD)), or the like.

The objectives, technical solutions, and beneficial effects of this application are further described in detail in the foregoing specific implementations. Any modification, equivalent replacement, or improvement made without departing from the spirit and principle of this application shall fall within the protection scope of this application.

What is claimed is:
1. A method, comprising:
  transcoding a plurality of source code blocks to obtain a to-be-encoded code block by:
    deleting synchronization header data of each source code block of the plurality of source code blocks to obtain remaining valid information, wherein a length of the remaining value information of each source code block is less than a length of the corresponding source code block; and combining the remaining valid information in the plurality of source code blocks to generate the to-be-encoded code block, wherein a length of the to-be-encoded code block is L, and L is a positive integer; and encoding the to-be-encoded code block to obtain a forward error correction (FEC) code, wherein a valid information length K of the FEC code is an integer multiple of a largest prime factor of L, and a total length N of the FEC code is a sum of K and a value, and the value is a product of 2 and an error correction capability T of the FEC code.

2. The method according to claim 1, wherein a quantity of bits comprised in each symbol in the FEC code is M, and M is a smallest even number satisfying $(2^M-1) \geq N$.

3. The method according to claim 1, wherein combining the remaining valid information in the plurality of source code blocks to generate the to-be-encoded code block comprises:

dividing the remaining valid information of each source code block into a pair of sub-code blocks, to form pairs of sub-code blocks;

combining first sub-code blocks in the pairs of sub-code blocks of the plurality of source code blocks to generate a first part of the to-be-encoded code block, and adding bit data before the first part of the to-be-encoded code block; and combining second sub-code blocks in the pairs of sub-code blocks of the plurality of source code blocks to generate a subsequent part of the to-be-encoded code block.

4. The method according to claim 3, wherein adding the bit data before the first part of the to-be-encoded code block comprises:

when the source code blocks plurality of source code blocks are all data blocks, adding synchronization header information including at least one bit before the first part of the to-be-encoded code block, wherein the synchronization header information indicates that the source code blocks of the plurality of source code blocks are all data blocks.

5. The method according to claim 3, wherein adding the bit data before the first part of the to-be-encoded code block comprises:

when the plurality of source code blocks comprise an ordered set block, adding synchronization header information including at least one bit before the first part of the to-be-encoded code block, and adding a hot code including a plurality of bits after the synchronization header information, wherein the synchronization header information indicates that the plurality of source code blocks comprise the ordered set block, and the hot code indicates a data type of each source code block of the plurality of source code blocks; and deleting at least two bits in a first byte of the ordered set block in the first part of the to-be-encoded code block.

6. The method according to claim 1, wherein before transcoding the source code block to obtain the to-be-encoded code block, the method further comprises:

performing encoding based on a 128B/130B encoding scheme to obtain at least one of the plurality of source code blocks.

7. The method according to claim 1, wherein transcoding the plurality of source code blocks to obtain the to-be-encoded code block comprises:

transcoding the plurality of source code blocks based on a 256B/258B transcoding scheme or a 128B/132B transcoding scheme, to obtain the to-be-encoded code block.

8. The method according to claim 1, wherein L=258, a quantity of bits comprised in each symbol in the FEC code is M, and:

N=192, K=172, T=10, and M=8; or
N=184, K=172, T=6, and M=8; or
N=96, K=86, T=5, and M=8.

9. An apparatus, comprising:

a transcoding circuit, configured to transcode a plurality of source code blocks to obtain a to-be-encoded code block by:

deleting synchronization header data of each source code block of the plurality of source code blocks to obtain remaining valid information, wherein a length of the remaining value information of each source code block is less than a length of the corresponding source code block; and combining the remaining valid information in the plurality of source code blocks to generate the to-be-encoded code block, wherein a length of the to-be-encoded code block is L, and L is a positive integer; and an encoding circuit, configured to encode the to-be-encoded code block to obtain a forward error correction (FEC) code, wherein a valid information length K of the FEC code is an integer multiple of a largest prime factor of L, a total length N of the FEC code is a sum of K and a value, the value is a product of 2 and an error correction capability T of the FEC code, and a quantity M of bits comprised in each symbol in the FEC code is determined according to N.

10. The apparatus according to claim 9, wherein the quantity of bits comprised in each symbol in the FEC code is M, and M is a smallest even number satisfying $(2^M-1) \geq N$.

11. The apparatus according to claim 9, wherein the transcoding circuit is configured to:

delete the synchronization header data of each of the plurality of source code blocks to obtain the remaining valid information;

divide the remaining valid information of each source code block into a pair of sub-code blocks, to obtain pairs of sub-code blocks;

combine first sub-code blocks in the pairs of sub-code blocks of the plurality of source code blocks to generate a first part of the to-be-encoded code block, and add bit data before the first part of the to-be-encoded code block; and combine second sub-code blocks in the pairs of sub-code blocks of the plurality of source code blocks to generate a subsequent part of the to-be-encoded code block.

12. The apparatus according to claim 11, wherein the transcoding circuit is configured to:

when the source code blocks of the plurality of source code blocks are all data blocks, add synchronization header information including at least one bit before the first part of the to-be-encoded code block, wherein the synchronization header information indicates that the source code blocks of the plurality of source code blocks are all data blocks.

13. The apparatus according to claim 11, wherein the transcoding circuit is configured to:
when the plurality of source code blocks comprise an ordered set block, add synchronization header information including at least one bit before the first part of the to-be-encoded code block, and add a hot code with a plurality of bits after the synchronization header information, wherein the synchronization header information indicates that the plurality of source code blocks comprises the ordered set block, and the hot code indicates a data type of each source code block; and
delete at least two bits in a first byte of the ordered set block in the first part of the to-be-encoded code block.

14. The apparatus according to claim 9, wherein the encoding circuit is further configured to perform encoding based on a 128B/130B encoding scheme to obtain the plurality of source code blocks.

15. The apparatus according to claim 9, wherein the transcoding circuit is configured to transcode the plurality of source code blocks based on a 256B/258B transcoding scheme or a 128B/132B transcoding scheme, to obtain the to-be-encoded code block.

16. A non-transitory computer-readable storage medium, wherein the computer-readable storage medium stores an instruction, and when the instruction is run on a computer, the instructions causes a computer to:
transcode a plurality of source code blocks to obtain a to-be-encoded code block by:
deleting synchronization header data of each source code block of the plurality of source code blocks to obtain remaining valid information, wherein a length of the remaining value information of each source code block is less than a length of the corresponding source code block; and
combining the remaining valid information in the plurality of source code blocks to generate the to-be-encoded code block, wherein a length of the to-be-encoded code block is L, and L is a positive integer; and
encode the to-be-encoded code block to obtain a forward error correction (FEC) code, wherein a valid information length K of the FEC code is an integer multiple of a largest prime factor of L, and a total length N of the FEC code is a sum of K and a value, and the value is a product of 2 and an error correction capability T of the FEC code.

* * * * *